(12) United States Patent
McGraw et al.

(10) Patent No.: US 12,442,068 B2
(45) Date of Patent: Oct. 14, 2025

(54) OVJP DEPOSITION NOZZLE WITH DELIVERY FLOW RETARDERS

(71) Applicant: Universal Display Corporation, Ewing, NJ (US)

(72) Inventors: Gregory McGraw, Yardley, PA (US); William E. Quinn, Whitehouse Station, NJ (US); William T. Mayweather, III, Robbinsville, NJ (US); Gregg Kottas, Ewing, NJ (US); Xin Xu, Plainsboro, NJ (US)

(73) Assignee: Universal Display Corporatior, Ewing, NJ (US)

( * ) Notice: Subject to any disclaimer, the term of this patent is extended or adjusted under 35 U.S.C. 154(b) by 242 days.

(21) Appl. No.: 16/324,703

(22) PCT Filed: Jul. 28, 2017

(86) PCT No.: PCT/US2017/044464
§ 371 (c)(1),
(2) Date: Feb. 11, 2019

(87) PCT Pub. No.: WO2018/023046
PCT Pub. Date: Feb. 1, 2018

(65) Prior Publication Data
US 2019/0218655 A1 Jul. 18, 2019

Related U.S. Application Data

(60) Provisional application No. 62/368,603, filed on Jul. 29, 2016.

(51) Int. Cl.
*C23C 14/22* (2006.01)
*C23C 14/04* (2006.01)
(Continued)

(52) U.S. Cl.
CPC ............ *C23C 14/228* (2013.01); *C23C 14/04* (2013.01); *C23C 14/12* (2013.01); *H10K 71/164* (2023.02); *H10K 85/141* (2023.02); *H10K 71/00* (2023.02)

(58) Field of Classification Search
CPC .................................................. C23C 14/228
See application file for complete search history.

(56) References Cited

U.S. PATENT DOCUMENTS 4,769,292 A 9/1988 Tang
5,247,190 A 9/1993 Friend
(Continued)

FOREIGN PATENT DOCUMENTS

CN 202671651 U 1/2013
CN 103160788 A 6/2013
(Continued)

OTHER PUBLICATIONS

Chinese Office Action for App No. CN201780046891.6, dated Apr. 14, 2020, 6 pages.
(Continued)

*Primary Examiner* — Keath T Chen
(74) *Attorney, Agent, or Firm* — Butzel Long

(57) ABSTRACT

OVJP depositors having an exhaust aperture incorporated into the center of a flow retarder (510) are provided. Multiple flow retarders may be used to increase uniformity for applications such as OLED lighting that require larger features. Flow retarders may transect a delivery aperture completely or may extend part way through its length.

21 Claims, 19 Drawing Sheets

(51) Int. Cl.
*C23C 14/12* (2006.01)
*H10K 71/16* (2023.01)
*H10K 85/10* (2023.01)
*H10K 71/00* (2023.01)

(56) References Cited

U.S. PATENT DOCUMENTS

| | | | |
|---|---|---|---|
| 5,460,653 A * | 10/1995 | Otani | B05B 13/041 118/668 |
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 6,013,982 A | 1/2000 | Thompson | |
| 6,073,578 A | 6/2000 | Shim | |
| 6,087,196 A | 7/2000 | Sturm | |
| 6,091,195 A | 7/2000 | Forrest | |
| 6,097,147 A | 8/2000 | Baldo | |
| 6,200,389 B1 * | 3/2001 | Miller | C23C 16/4405 118/724 |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 7,279,704 B2 | 10/2007 | Walters | |
| 7,431,968 B1 | 10/2008 | Shtein | |
| 7,968,146 B2 | 6/2011 | Wagner | |
| 2003/0094254 A1 * | 5/2003 | Duan | B05B 7/10 34/465 |
| 2003/0230980 A1 | 12/2003 | Forrest | |
| 2004/0174116 A1 | 9/2004 | Lu | |
| 2004/0224433 A1 * | 11/2004 | Yamazaki | H01L 51/0022 438/39 |
| 2005/0011752 A1 * | 1/2005 | Yamazaki | H01L 21/2855 204/192.15 |
| 2005/0087131 A1 * | 4/2005 | Shtein | H01L 51/0013 427/248.1 |
| 2005/0105067 A1 * | 5/2005 | Chibana | G03F 7/70933 355/53 |
| 2006/0127599 A1 * | 6/2006 | Wojak | C23C 16/453 423/446 |
| 2008/0145190 A1 * | 6/2008 | Yassour | H01L 21/00 294/64.3 |
| 2008/0152806 A1 * | 6/2008 | Forrest | H01L 51/0008 427/255.26 |
| 2009/0090298 A1 * | 4/2009 | King | B05B 7/0441 118/300 |
| 2009/0128787 A1 * | 5/2009 | Yamamoto | H01L 21/6715 355/30 |
| 2009/0280247 A1 * | 11/2009 | Forrest | C23C 14/243 427/255.6 |
| 2010/0208020 A1 * | 8/2010 | Matsumoto | B41J 11/00214 347/102 |
| 2011/0006040 A1 * | 1/2011 | Savas | C23C 16/407 427/579 |
| 2011/0008541 A1 * | 1/2011 | Madigan | C23C 14/04 427/256 |
| 2011/0187798 A1 * | 8/2011 | Rogers | B41J 2/06 347/55 |
| 2012/0141676 A1 * | 6/2012 | Sershen | C23C 16/4412 118/729 |
| 2013/0012029 A1 * | 1/2013 | Vermeer | C23C 16/0245 438/758 |
| 2014/0245950 A1 * | 9/2014 | Seccombe | B05C 5/0208 118/620 |
| 2015/0008825 A1 * | 1/2015 | Eden | H01J 37/32513 315/111.21 |
| 2015/0380648 A1 | 12/2015 | McGraw | |
| 2017/0229663 A1 | 8/2017 | Tsai | |

FOREIGN PATENT DOCUMENTS

| | | |
|---|---|---|
| CN | 103303016 A | 9/2013 |
| CN | 105316623 A | 2/2016 |
| KR | 100277833 B1 | 1/2001 |
| WO | 2008057394 A1 | 5/2008 |
| WO | 2010011390 A2 | 1/2010 |

OTHER PUBLICATIONS

Baldo et al. Highly efficient phosphorescent emission from organic electroluminescent devices, Nature, vol. 395, pp. 151-154, 1998.
Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.
International Search Report and Written Opinion issued in PCT/US2017/044464, dated Nov. 3, 2017, 11 pages.
Korean Office Action (with English translation) for App. No. KR10-2019-7006296, dated Feb. 16, 2021, 10 pages.
Chinese Office Action issued in App No. CN202110133349.2, dated Sep. 29, 2022, 11 pages.
Chinese Office Action (with partial English translation) issued in App. No. CN202110133349, dated Jan. 20, 2024, 8 pages.
Chinese Office Action issued in App. No. CN202110133349, dated Oct. 31, 2023, 9 pages.
Lyon Laurent, Mechanized sprinkler irrigation, p. 258, Dec. 31, 1982 (with English translation).

* cited by examiner

FIG. 18A
FIG. 18B
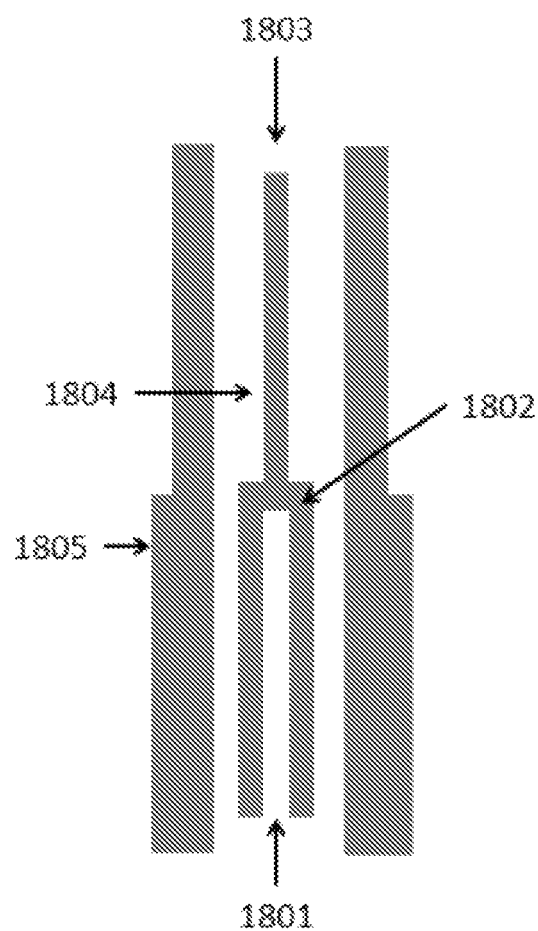
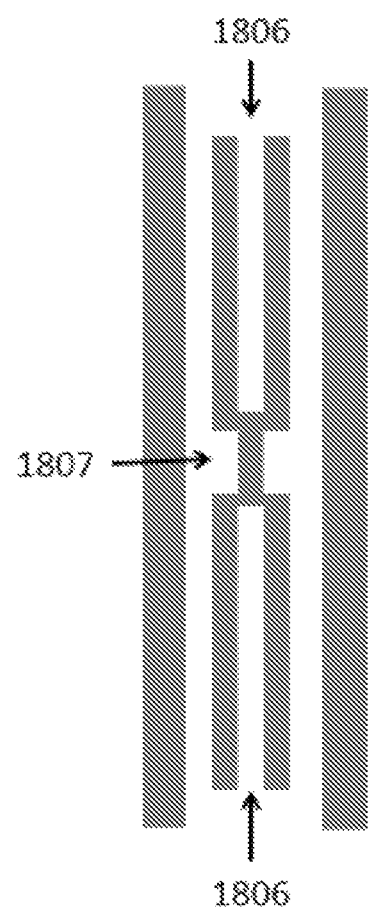

OVJP DEPOSITION NOZZLE WITH DELIVERY FLOW RETARDERS

CROSS-REFERENCE TO RELATED APPLICATIONS

This application claims priority to U.S. Provisional Patent Application Ser. No. 62/368,603, filed Jul. 29, 2016, the entire contents of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to systems and method for organic vapor jet printing (OVJP) and organic devices fabricated therewith, and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

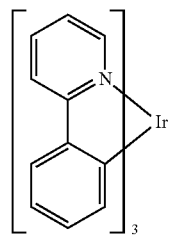

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

OVJP depositors and fabrication techniques are provided that include the use of a system having a delivery channel, a solid flow retarder disposed within the delivery channel; and an exhaust channel disposed adjacent to the delivery channel, wherein the solid flow retarder is inset behind a delivery aperture of the delivery channel.

BRIEF DESCRIPTION OF THE DRAWINGS

FIG. 18A and FIG. 18B show examples of OVJP depositor configurations with one or more partial retarders in the delivery aperture according to embodiments disclosed herein.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
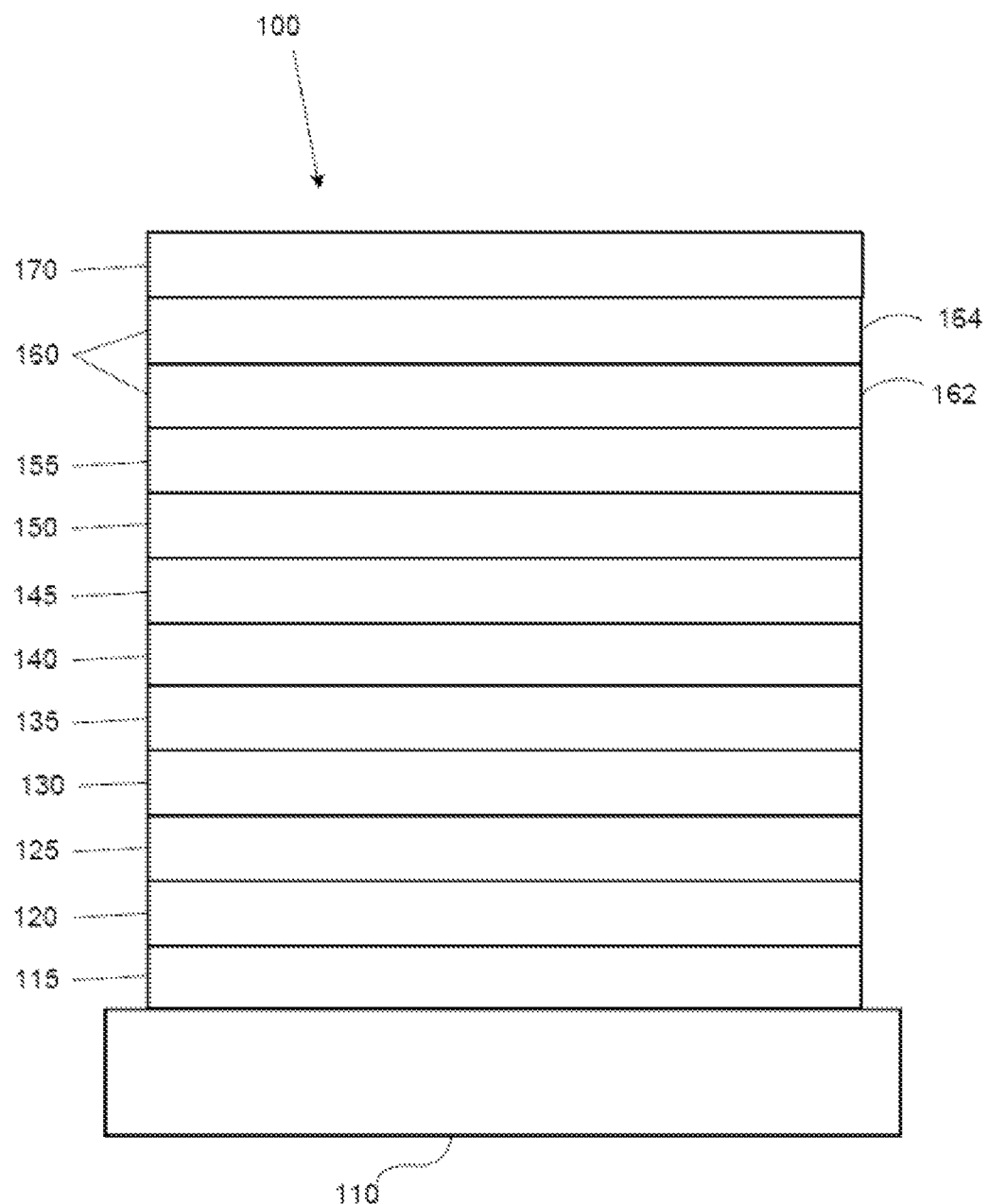
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
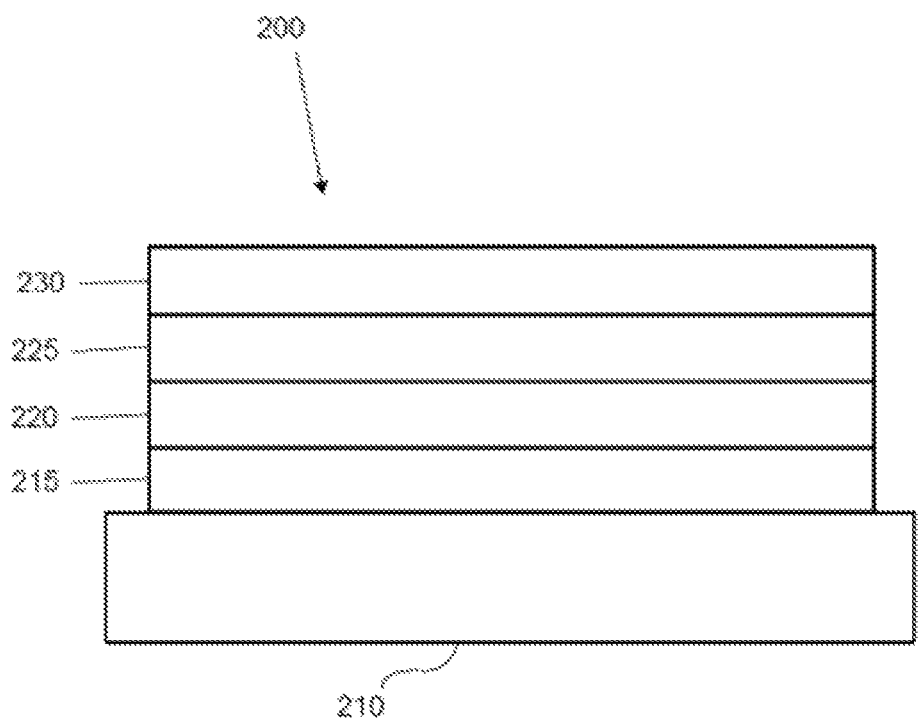
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, micro-displays less than 2 inches diagonal, 3-D displays, virtual reality or augmented reality displays, vehicles, video walls comprising multiple displays tiled together, theater or stadium screens, and signs. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to +80 C.

Fabrication techniques used to deposit organic display materials, such as OVJP, generally are designed to meet several criteria, including printed line width, material overspray, thickness uniformity in the pixel, source material utilization, rapid start and stop of printing, and others. OVJP utilizes a carrier gas to transport organic material from a heated source container to the print nozzle assembly which is in close proximity to a substrate. The design of the print nozzle assembly and the deposition conditions determine characteristics of the printed line. Early versions of the print nozzle were capable of producing printed lines with the required line width (on the order of 50 μm). However, these lines often had unacceptable or undesirable degrees of overspray. Early OVJP systems also often could not be started and stopped rapidly. Recently, OVJP systems have been developed that include a micronozzle array technology which utilizes a combination of deposition apertures surrounded by exhaust apertures and a gas confinement flow to confine the line width and overspray. Such arrangements may be referred to as Deposition Exhaust Confinement (DEC) systems. Examples of such systems and techniques are disclosed in U.S. Patent Publication No. 2017/0101711, U.S. Patent Publication No. 2017/0104159, U.S. patent application Ser. No. 15/449,946, filed Mar. 4, 2017, U.S. patent application Ser. No. 15/475,408, filed Mar. 31, 2017, the disclosure of each of which is incorporated by reference in its entirety.

Embodiments disclosed herein provide DEC-type depositors that incorporate a solid retarder that splits the deposition aperture into distinct sections. Such configurations may increase material utilization efficiency and deposition purity, while reducing TAKT time. Multiple flow retarders may be used to increase uniformity for applications such as OLED lighting that require larger features. Flow retarders may transect a delivery aperture completely or may extend part way through its length. The tip of a retarder may be flush with the delivery aperture, recessed within the delivery channel, and/or askew with respect to the plane of the delivery aperture. Various configurations may be used to obtain desired deposition profiles. Some embodiments may provide an exhaust aperture incorporated into the center of a flow retarder.

Gas confinement is a departure from, and may provide benefits over previous OVJP techniques since it requires a chamber pressure of 50 to 300 Torr, rather than the high vacuum typical of prior OVJP systems. Overspray may be reduced or eliminated by using a flow of confinement gas to prevent the diffusion and transport of organic material away from the desired deposition region.

Figure 3:
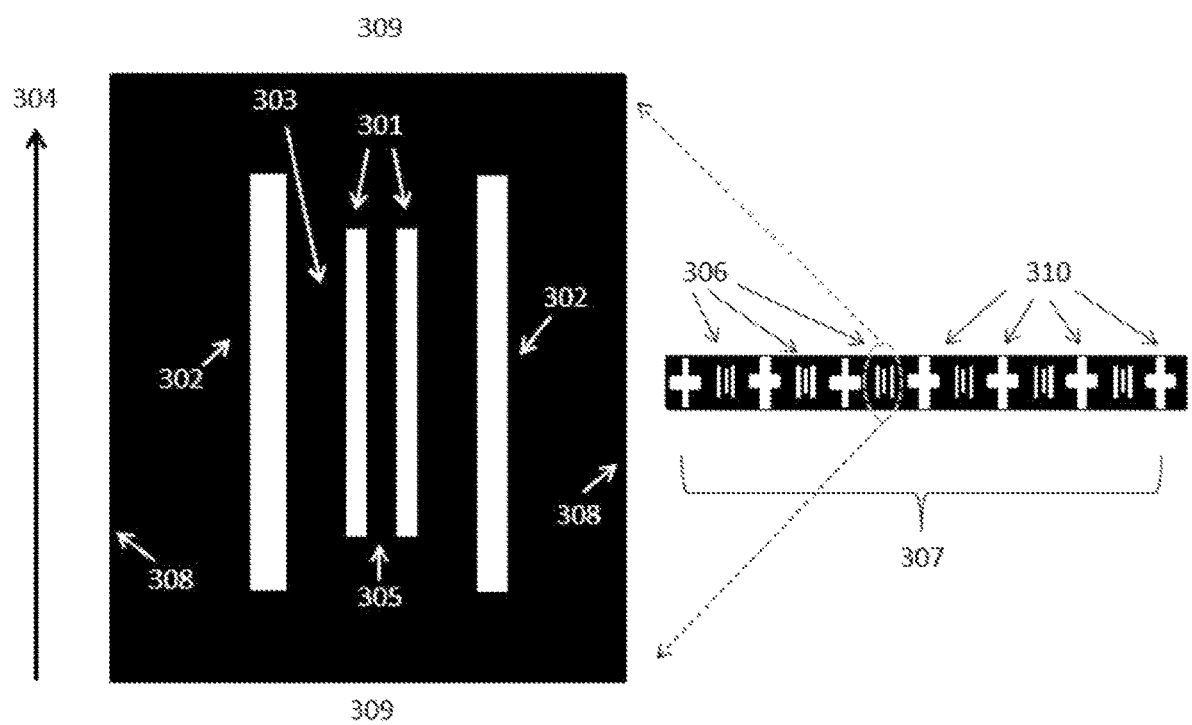
FIG. 3 shows an OVJP depositor with a hydrodynamic retarder and the micronozzle array on which it and others are arranged.

A DEC depositor design according to an embodiment disclosed herein is shown from the perspective of the substrate in FIG. 3. This arrangement uses one or more rectangular delivery apertures 301 located between a pair of exhaust apertures 302. The flow through the delivery apertures contains organic vapor entrained in an inert delivery gas. The exhaust apertures withdraw gas from the region under the depositor at a mass flow rate exceeding the delivery flow. They remove the delivery flow and any surplus organic vapor entrained within it, as well as a balance of confinement gas drawn from the ambient surrounding the depositor. Delivery and exhaust apertures are separated by a DE spacer width 303. The apertures are arranged so that the long axes are parallel to the direction of printing 304. A solid section called the flow retarder 305 can be positioned between the delivery apertures to modulate the delivery gas flux profile impinging onto the substrate.

Depositors 306 typically arranged linearly on a micronozzle array 307, so that each depositor borders another depositor on at least one side boundary 308. The top and bottom edges of the depositor 309 are defined by the edges of a linear micronozzle array. Distribution channels 310 placed between depositors may provide a source of confinement gas along the sides of each depositor. Alternately, confinement gas may flow in from the edges of the depositor, particularly if these channels are omitted. Arrays may be designed to minimize crosstalk between depositors. Accordingly, multiple printed features may be as close to identical as possible across the width of the depositor array. Additional exhaust apertures may be placed at other locations, for example at the ends of the array, to reduce or eliminate edge effects. The flow field under a micronozzle array may have periodic symmetry if the array is well designed.

The average thickness t of a printed film is given by $t=\eta_e j\tau/\rho$, where j is the mass flux of organic vapor onto the substrate, $\tau$ is the period of time a given point on the substrate is under the aperture, and $\rho$ is the density of the condensed organic material. The utilization efficiency, $\eta_e$, is the fraction of organic vapor issuing from the depositor that condenses on the substrate. If l is the length of the aperture and v is the relative velocity of the substrate, $\tau=l/v$. Since longer delivery apertures permit a given point on the substrate surface to remain under the aperture for a greater time at a given print speed, they promote faster printing. However, delivery aperture dimensions are subject to the limitations of their fabrication process. For example, a delivery aperture may be about 20-30× longer than wide if fabricated using deep reactive ion etching (DRIE). Smaller nozzles print higher resolution features, but fabrication and operational concerns usually set the practical minimum size. For example, optimal delivery apertures for printing features for 50 μm wide OLED subpixels have a width of about 15-20 μm when fabricated by DRIE.

Figure 4A:
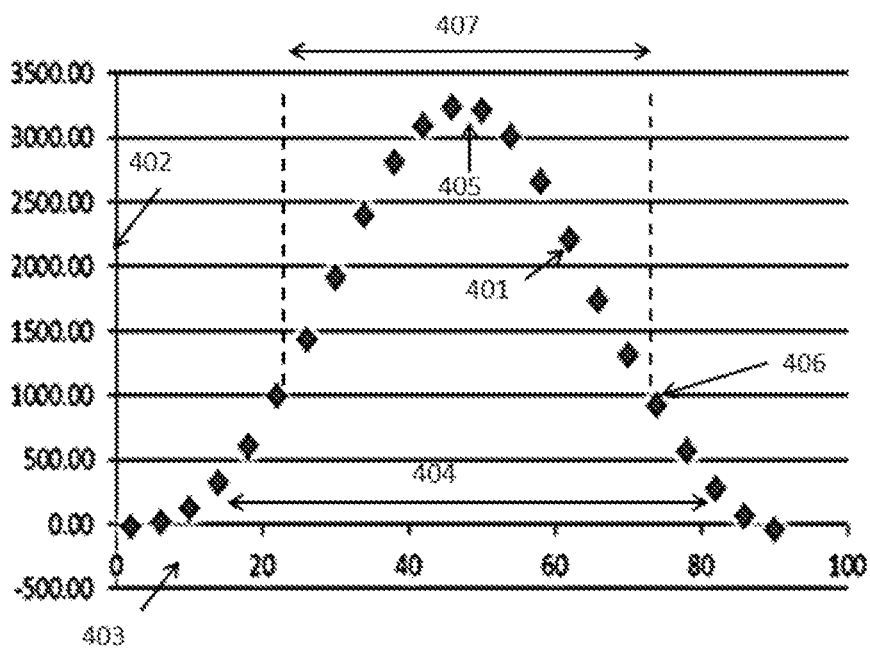
FIG. 4A shows a thickness cross section of an example feature printed by an OVJP depositor according to an embodiment disclosed herein.

There are two basic criteria for the shape of a deposited feature: width and thickness uniformity. FIG. 4A shows a cross-sectional thickness profile of a feature printed by OVJP. As shown, the profile of a feature 401 typically approximates a Gaussian. The vertical axis 402 shows film thickness in arbitrary units, and the horizontal axis 403 shows the location in the x direction in microns. The width includes both the gross feature and any overspray surrounding the feature, since overspray can contaminate adjacent features and limit resolution. Full width to 5% of maximum (FW5M) is the width 404 between two points on the opposite sides of a feature cross section that are at 5% (405) of the maximum curve height. The FW5M can be considered the practical feature width. It typically is desirable for the FW5M to be less than 3× the desired subpixel width for high resolution display application. The uniformity of a deposition refers to the difference between the maximum and minimum thickness 406 over a given width 407, across the center of the feature, divided by the average thickness over the same width 407. Printed OLEDs must have uniform thickness over their active width to operate properly. This width typically is about 50 μm for a 55" 4K-resolution display, and the uniformity over this width is referred to as $U_{50}$.

Figure 4B:
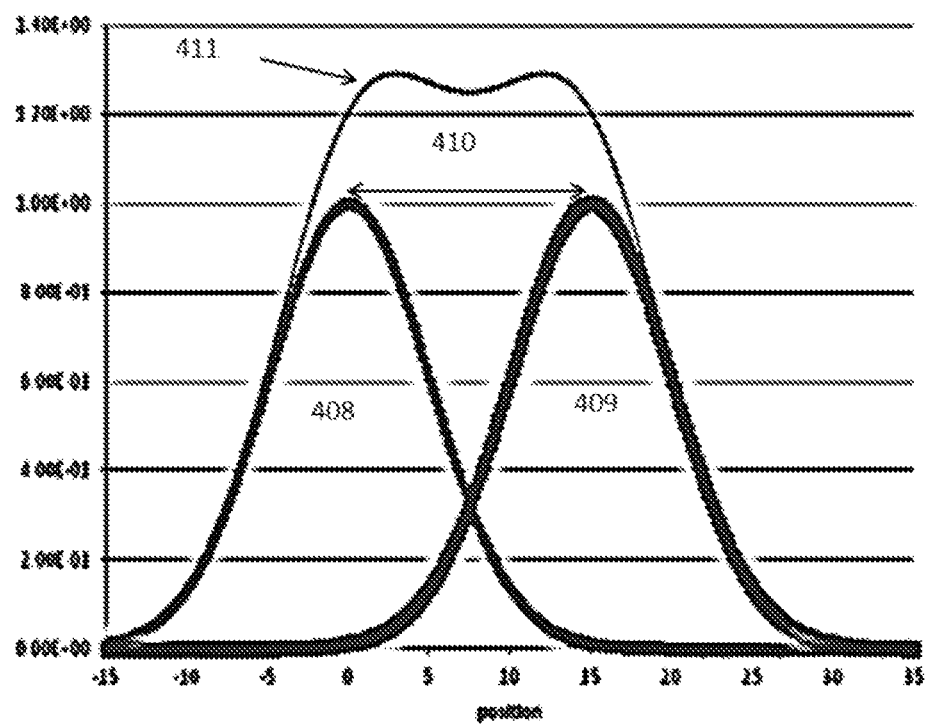
FIG. 4B shows a thickness cross section of the superposition of two features printed by OVJP depositors.

If single-pass uniformity is poor, adequate uniformity may be achieved by printing each feature in two or more passes. FIG. 4B shows a cross-sectional thickness profile of a feature printed using multiple passes. The thickness profiles for two passes 408, 409 with an offset of somewhat less than the pixel width between the print passes 410 are shown. The two offset features superimpose to create a composite feature 411 that has a more mesa-like profile. Double printing also may increase TAKT time compared with single pass printing, and therefore is often desirable to avoid.

Furthermore, printing in multiple passes creates an interval during which the emissive layer (EML) of an OLED is partially printed and, therefore, more vulnerable to environmental contamination, than a completed feature. For example, it has been shown in H. Yamamoto et al., "Identification of device degradation positions in multilayered phosphorescent organic light emitting devices using water probes" Appl. Phys. Lett. 100 1833060 (2012), that the operational lifetime of a phosphorescent OLED is significantly reduced if it is exposed to traces of water vapor between the initiation and completion of EML growth. The lifetime is much less sensitive to contamination once the EML is completed. The time between start and completion of a 300 Å thick EML is on the order of 0.1 s or less for a subpixel printed by OVJP. If only a single printing pass is required, the interval in which the EML may become contaminated is negligible. In contrast, vacuum thermal evaporation (VTE) requires one or more minutes to deposit a complete EML, which indicates that a single-pass OVJP process may be capable of depositing even higher purity films than VTE.

Figure 5:
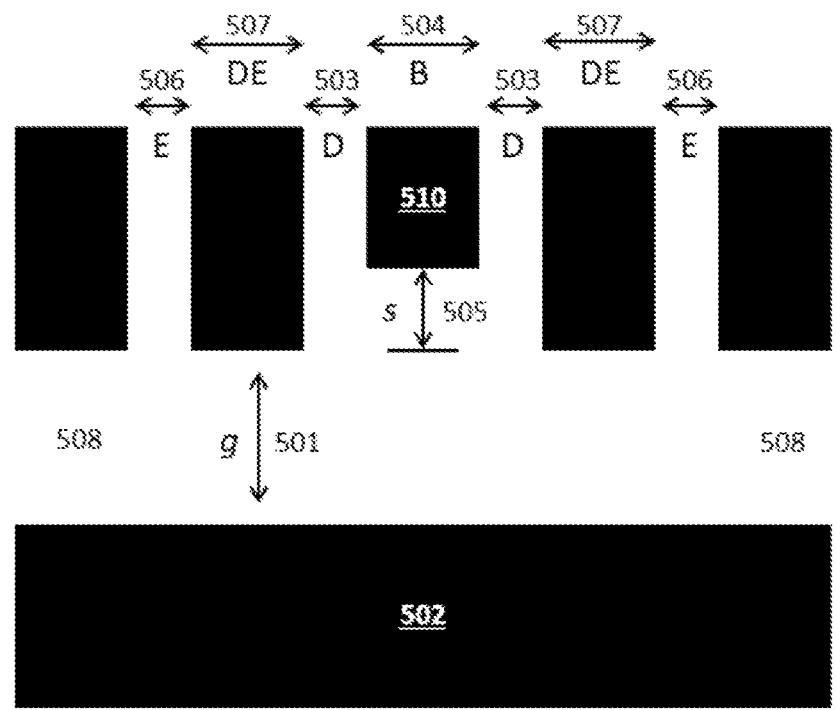
FIG. 5 shows a cross sectional view and relative dimensions of an OVJP depositor according to an embodiment disclosed herein.

FIG. 5 shows an example of a depositor element in cross section, viewed normal to the direction of printing. The "fly height" g 501 refers to the separation between the lowest point of the depositor and the substrate 502. The width 503 of each delivery aperture is given by D. In an embodiment, a single, solid flow retarder 510 placed between the delivery apertures with width B 504. The tip of the flow retarder may be positioned further away from the substrate than the fly height, at an inset length s 505 between the retarder and the lowest point of the depositor, i.e., the end of the fly height 501. The exhaust aperture width 506 is E and the width of the spacer 507 between it and the adjacent delivery aperture is DE. The depositor is usually, although not necessarily, symmetrical. That is, D, DE, and E may be the same on either side of the flow retarder 510, or they may be different on each side. Confinement gas typically enters the fly height gap through the sides of the depositor at 508.

Figure 6:
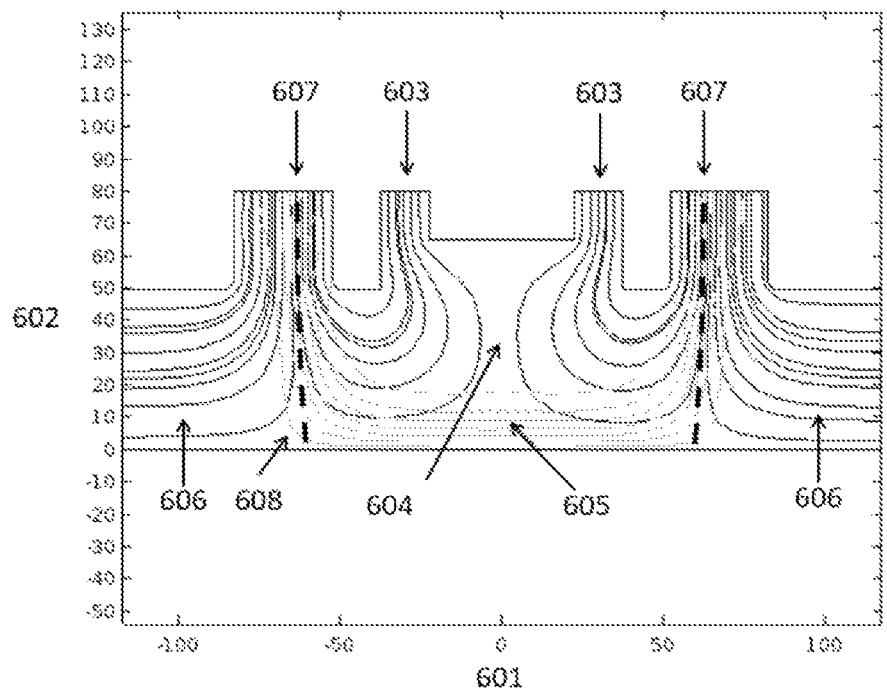
FIG. 6 shows an example of process gas flow streamlines around an OVJP depositor with a hydrodynamic retarder in its delivery aperture according to an embodiment disclosed herein.

FIG. 6 shows an example of gas flow through a depositor according to an embodiment disclosed herein. The distance in the direction x, orthogonal to the substrate normal and to the direction of printing, is given in microns by the horizontal axis 601. The distance parallel to the substrate normal, referred to as the z axis, is given in microns by the vertical axis 602. The direction of printing corresponds to they axis. Delivery flows 603 of 1 sccm $N_2$ enter through each side of the delivery aperture. A flow retarder disposed between the apertures, such as the flow retarder 510 described with respect to FIG. 5, creates a region of relatively stagnant flow 604 beneath it. The presence of the relatively stagnant flow may reduce the convective transport of organic vapor onto the substrate underneath the retarder, and prevent a sharp maximum of organic flux near the center of the depositor cross section. Contours indicating the normalized organic vapor pressure 605 are overlaid with the streamlines. The contours are nearly horizontal between x=−30 μm and x=30 μm. While they are not evenly spaced, they are parallel, which indicates a spatially uniform downward diffusive flux of organic vapor in this region.

The confinement flow 606 enters through the sides of the depositor. It abuts the delivery flow, which may force both flows to turn relatively sharply upward and exit the deposition zone through the exhaust aperture. The delivery and confinement flows meet along a stagnation surface 607 defined as the region where the velocity in the x direction, $v_x$, is zero or approximately zero. Organic vapor is deposited in the region between the stagnation surfaces. The organic vapor partial pressure quickly drops to negligible levels outside the stagnation plane. The vertical leg of the outer contour of the partial pressure field 608, which indicates the lowest concentration, closely follows the stagnation plane. Stray vapor beyond the stagnation plane is taken up by the confinement gas and driven into the exhaust aperture.

Figure 7:
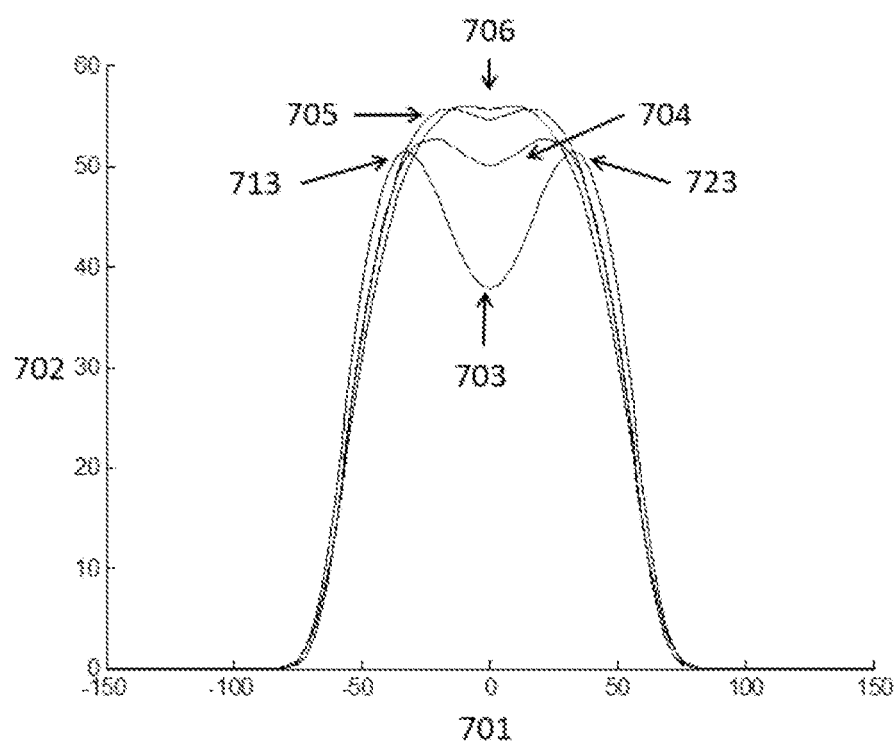
FIG. 7 shows the thickness cross sections of features printed by OVJP depositors with flow retarders positioned at varying degrees of inset according an embodiments disclosed herein.
Figure 8:
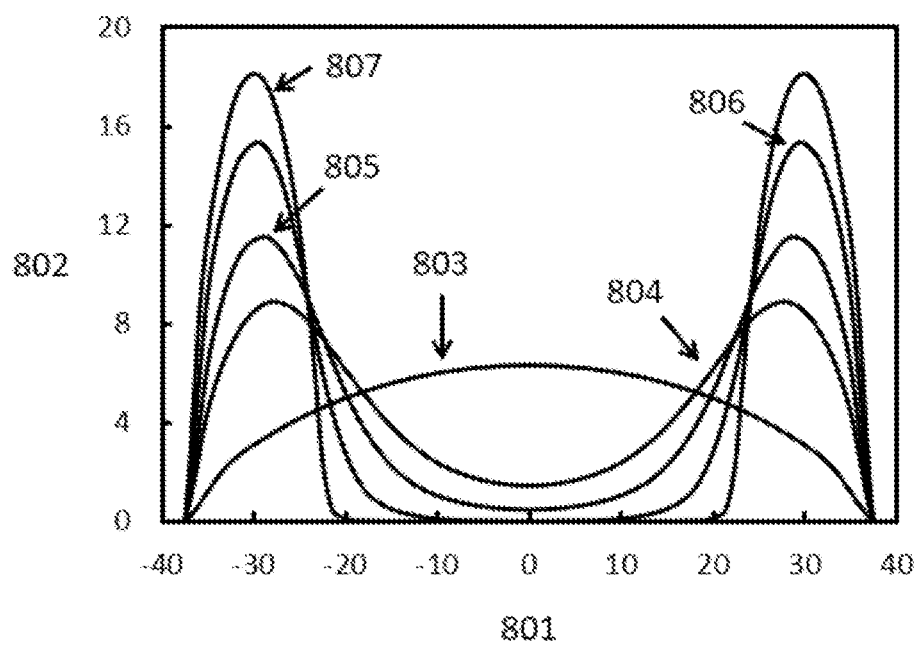
FIG. 8 shows an example of the flow velocity of delivery gas across a delivery aperture of OVJP depositors with flow retarders positioned at varying degrees of inset according to an embodiment disclosed herein.
Figure 9A:
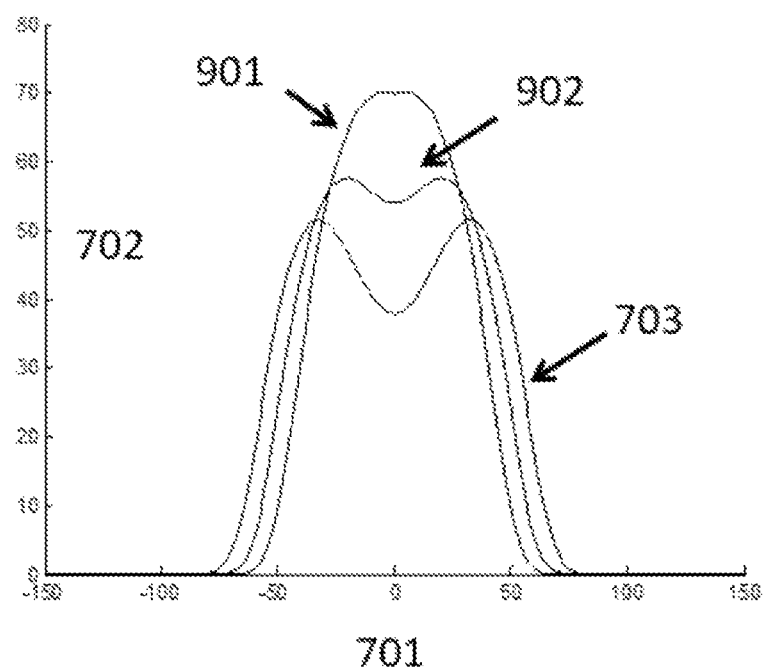
FIG. 9A and FIG. 9B show examples of thickness cross sections of features printed by OVJP depositors with flow retarders of varying width positioned at varying degrees of inset according to an embodiment disclosed herein.
Figure 9B:
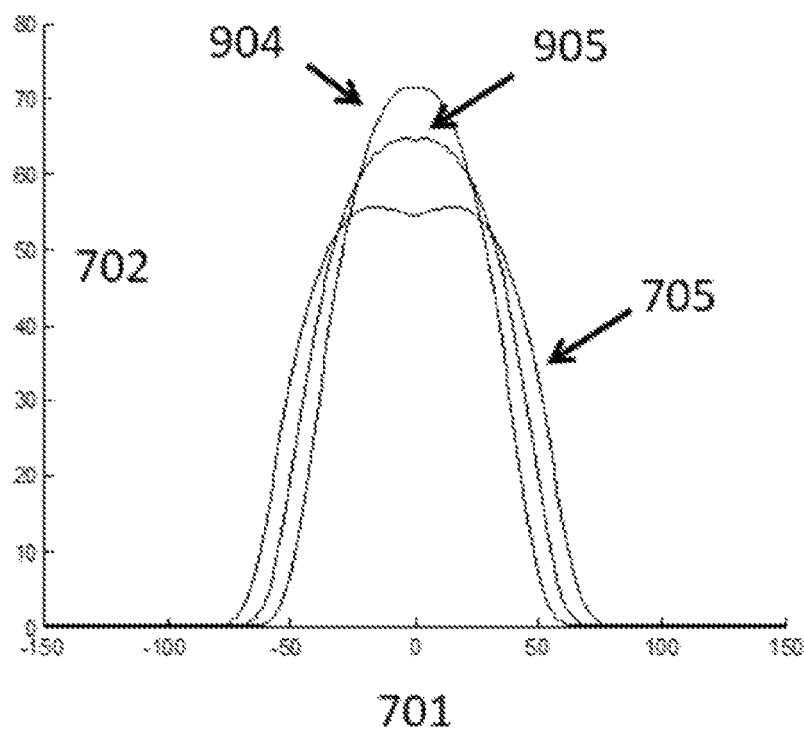

The effect of a hydrodynamic retarder as disclosed herein is apparent in the cross sectional thickness profiles of thin film features printed by an OVJP depositor, examples of which are shown in FIG. 7. Displacement along the x is given in microns by the horizontal axis 701. The vertical axis 702 gives film thickness in arbitrary units. Referring to the dimensions shown in FIG. 5, the case of a depositor with B=45 μm, D=15 μm, DE=15 μm, E=30 μm, and g=50 μm was simulated as described below. The profiles shown in FIG. 7 are for flow retarders with s varying from 0 μm to 15 μm.

Figure 10A:
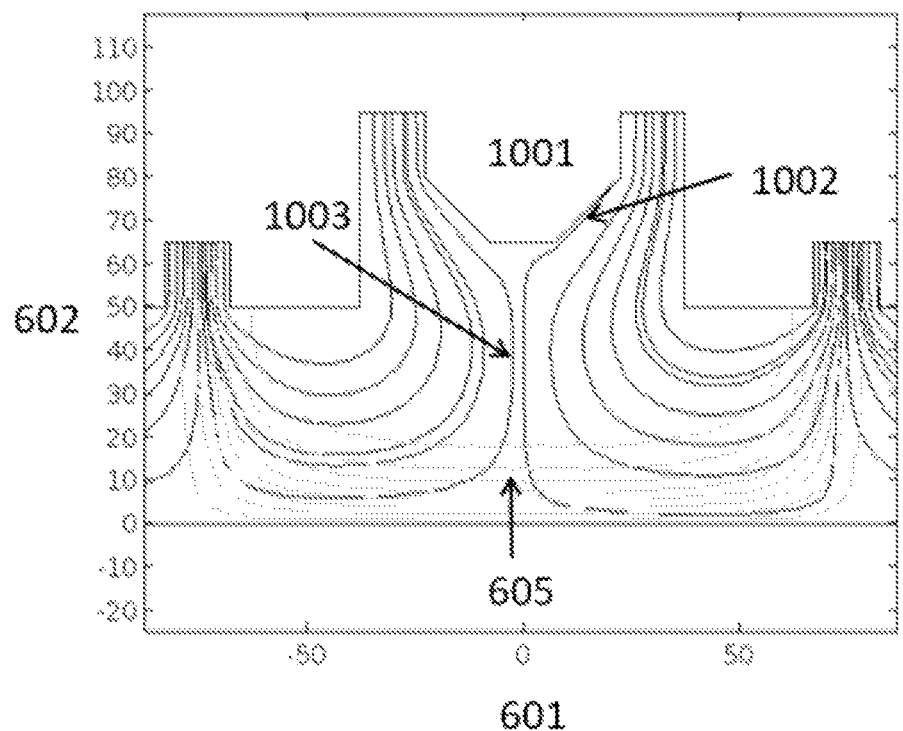
FIG. 10A and FIG. 10B show the effect on the process gas flow field and feature thickness profile produced by a chamfered flow retarder according to an embodiment disclosed herein.
Figure 10B:
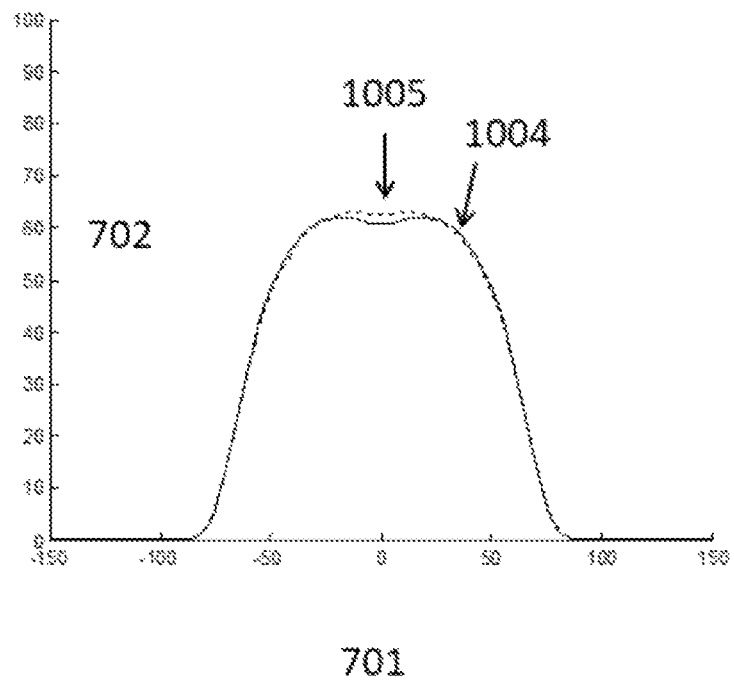

As shown by FIG. 7, when the tip of the flow retarder is flush with the exhaust apertures at s=0, the retarder may split the delivery flow into two well defined jets that produce a deposition profile 703 having relatively well-defined peaks 713, 723 below each aperture. In this case, the flow in the region between the jets is relatively stagnant and mass transport near the center is impeded. This can be remedied by insetting the tip of the retarder with respect to the delivery aperture, as previously disclosed with respect to FIG. 5. This may increase the downward velocity of gas near the depositor center and result in a flatter, more mesa-like feature profile. The s=10 μm profile 704 shows clear improvement relative to the s=0 arrangement, and the feature appears to be nearly optimized for s=15 μm 705. The deposition profile 706 becomes approximately Gaussian if the flow retarder is removed, leaving a continuous delivery aperture with the same side to side width as the previous examples. The deposition profile is less uniform due to its central peak. The properties of features printed by this depositor geometry are summarized in Table I. The full width at 5% of maximum (FWSM) and $\eta_e$ are relatively unaffected by the inset distance s, although both appear to be optimized for the s=15 μm case in this embodiment. Situating the tip of the flow retarder beyond the delivery aperture, so that s is negative generally may not be beneficial because it reduces the minimum separation between the depositor and substrate. A depositor without a protruding flow retarder can be moved closer to the substrate and therefore achieve superior performance for a given fly height tolerance.

The effect of the inset length s of a hydrodynamic retarder on the flow field leaving a delivery aperture in an arrangement as disclosed herein is illustrated in FIG. 8. The horizontal axis 801 is the x coordinate in microns, while the vertical axis 802 is the downward velocity of gas, $-v_z$, in m/s through the delivery aperture at the x coordinate along the midline of the aperture. When the flow retarder is absent, the gas flow field 803 is relatively broad and parabolic with a maximum velocity in the center. When a flow retarder is present and inset at s=15 μm, the flow field 804 is driven outward towards the edges but still exhibits a relatively significant downward motion of gas near x=0. When the offsets is decreased to 10 μm, 5 μm, and 0 μm, the flow is progressively reduced under the flow retarder until it is negligible as shown by the fields 805, 806, and 807, respectively. The maximum velocity of the delivery gas flowing around the flow retarder increases as s approaches 0.

A narrower flow retarder may reduce the disruption of flow near the center of the delivery aperture compared to a wider one, but a narrow flow retarder with a short inset is not equivalent to a wide flow retarder with a deep inset. A depositor with a narrower flow retarder generally prints narrower features overall, which may permit higher-resolution printing. It also reduces the width of the mesa at the center of the feature, lowering $U_{50}$. The effects of these two parameters according to an embodiment disclosed herein are illustrated in FIG. 9. FIG. 9A shows deposition profiles generated by depositors with flow retarder of varying width situated at an offset of s=0. A narrow flow retarder with B=15 μm prints a feature with a relatively flat but narrow tip 901. Increasing the flow retarder width to B=30 μm results in a wider profile 902, but stagnant flow near the center of the depositor creates a marked local minimum in deposition at x=0 and $U_{50}$ is relatively poor. This local minimum becomes more severe for the case of B=45 μm, as shown by the previously-presented profile 703. FIG. 9B shows deposition profiles of features deposited by flow retarders inset by s=15 μm. For B=15 μm, the feature has a nearly Gaussian profile 904 because a narrow, deeply insert flow retarder generally has a relatively minimal effect on the gas flow through the delivery aperture. Uniformity is therefore relatively poor. The printed feature is broader and more uniform for B=30 μm as shown by the profile 905. However, the profile 905 still has a relatively rounded top. A near-optimal feature shape 705 may be achieved with B=45 μm, as previously disclosed. Specifying both the width and inset of the flow retarder permits some independence between the width and flatness of the central region of the printed feature where uniformity of most interest. These parameters can be balanced to produce a desired feature shape. The properties of these printed features are summarized in Table I.

TABLE I

| s (μm) | B (μm) | FW5M (μm) | $U_{50}$ (%) | $\eta_e$ (%) |
|---|---|---|---|---|
| 0 | 45 | 132 | 73.5 | 8.67 |
| 5 | 45 | 129 | 85.5 | 8.39 |
| 10 | 45 | 128 | 94.8 | 9.02 |
| 15 | 45 | 127 | 98.1 | 9.35 |
| inf | 45 | 129 | 95.4 | 9.17 |
| 0 | 30 | 115 | 93.4 | 8.78 |
| 15 | 30 | 110 | 90.2 | 8.97 |
| 0 | 15 | 98.9 | 86.2 | 8.61 |
| 15 | 15 | 95.6 | 79.6 | 8.21 |

In some embodiments, alternate flow retarder geometries may be used. For example, a flow retarder as disclosed herein need not be blunt-tipped as shown and described with respect to FIG. 6, but can have an arbitrary shape. FIG. 10 shows an example process gas flow for a flow retarder 1001 with chamfered sides 1002 but a constant cross section in they direction. The chamfer may permit more downward vapor flow in the region 1003 underneath the flow retarder, as can be seen by the parallel streamlines along x=0 that are not present in FIG. 6. A comparison of feature properties printed by depositors with B=45 μm, D=15 μm, DE=30 μm, E=15 μm and g=50 μm are given in Table II. Geometry A features a blunt-tipped retarder with s=15 μm. Geometry B features a 15 μm wide, 45° chamfer on each side of the retarder with s=5 μm. The deposition profiles 1004, 1005 for Geometries A and B, respectively, are shown in FIG. 10B. As illustrated, the cross-section of the flow retarder has a similar effect to insetting the flow retarder within the delivery aperture, and the two techniques may be used simultaneously. In some embodiments, the chamfered retarder may offer s slight $U_{50}$ advantage over a blunt-tipped flow retarder by promoting smoother streamlines of flow through the delivery aperture center.

Figure 11A:
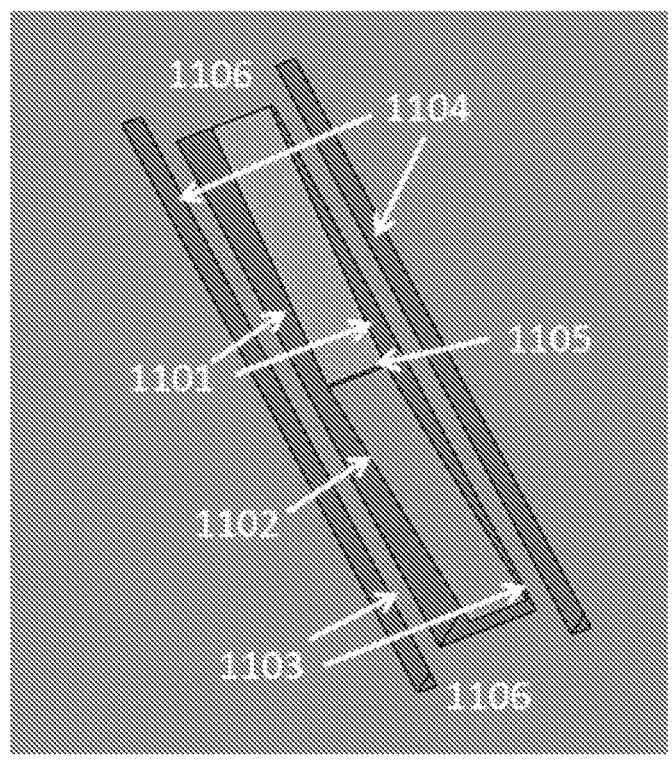
FIG. 11A shows a rendering of a depositor with a flow retarder that varies in inset as a function of length according to an embodiment disclosed herein.

In an embodiment, a flow retarder as disclosed herein also may have a variable cross section in they direction so that the inset varies along the length of the depositor. This may be a deliberately designed feature, or it may be a consequence of fabrication. For example, DRIE tends to undercut the tip of the flow retarder. FIG. 11A shows a schematic representation of a depositor formed from an undercut flow retarder after the component wafers are bonded. This depositor, referred to as Geometry C, includes two delivery apertures 1101 with a flow retarder 1102 positioned between them. Beyond the delivery apertures are DE spacers 1103 that are not inset. On the other side of the DE spacers is a pair of exhaust apertures 1104. The flow retarder has a minimum inset at y=0 1105 and its largest inset at the ends of the depositor 1106.

Figure 11B:
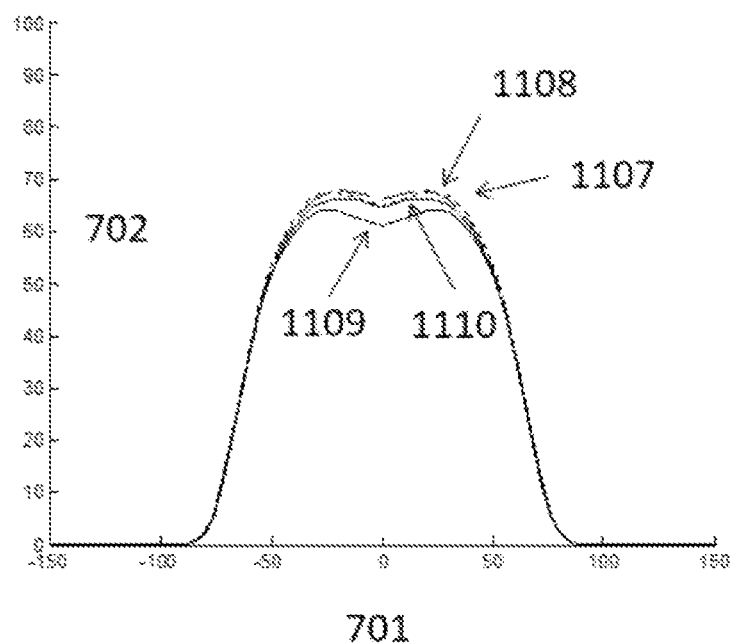
FIG. 11B shows the thickness profiles generated by a depositor as shown in FIG. 11A and related depositors according to embodiments disclosed herein.

An example of a deposition profile 1107 obtained with a depositor having a C-type geometry is shown in FIG. 11B. The deposition profile 1108 from a depositor with a flow retarder tip with a constant inset of s=15 μm is shown for comparison. In another embodiment, Geometry D, the angle of the flow retarder tip is reversed so that s=30 μm at the center of the depositor and s=0 μm. The corresponding flow profile 1109 is also shown in FIG. 11B. While the flat, inset retarder may provide superior uniformity to either angled retarder, the two angled retarders deposit features with similar uniformity despite being oppositely angled. Regions in which s is larger than the optimal shift deposition towards the center of the profile, while regions in which s smaller than the optimal shift it further outside. The local effects of the flow retarder are averaged over the length of the depositor as it moves relative to the substrate. Uniformity is therefore relatively insensitive to small variation in the flow retarder inset with y, but not to the average inset. For example, Geometry E is Geometry C modified to have a minimum inset of s(y=0)=10 μm, and prints a feature 1110 that is more uniform than a feature generated by Geometry C. Geometry D has $\eta_e$ inferior to A and C. The combination of greater confinement flow near the ends of the depositor and a more prominent flow retarder in the same region creates delivery gas starvation near the ends of the deposition zone.

Figure 12A:
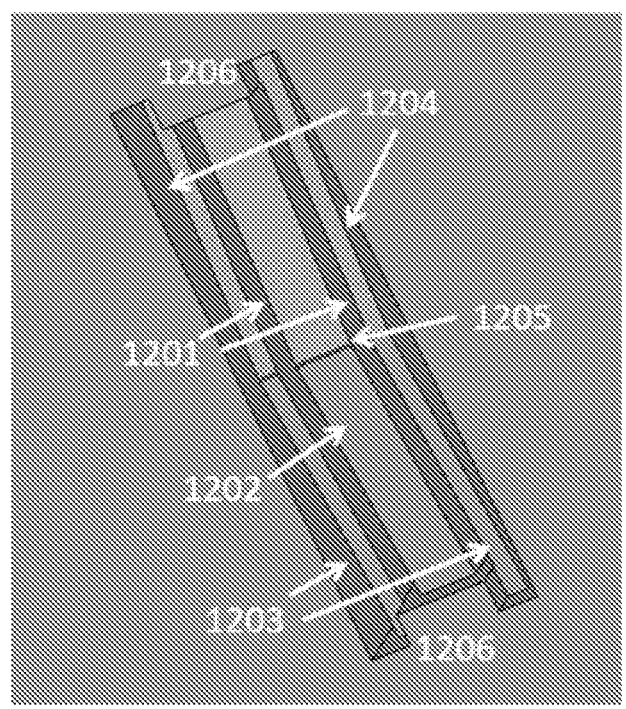
FIG. 12A shows a rendering of a depositor with a flow retarder and spacers that vary in inset as a function of length according to an embodiment disclosed herein.
Figure 12B:
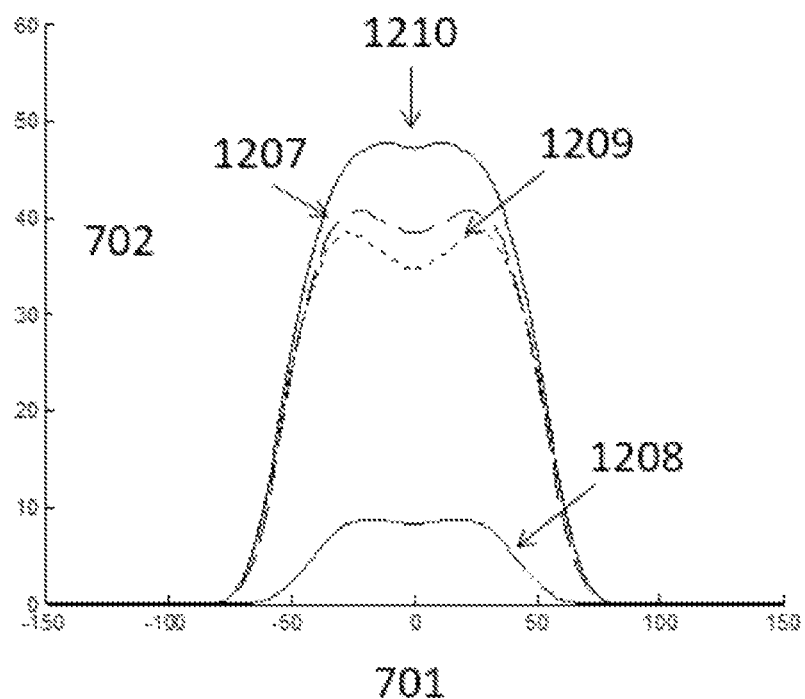
FIG. 12B shows thickness profiles generated by a depositor as shown in FIG. 12A and related depositors according to embodiments disclosed herein.
Figure 13:
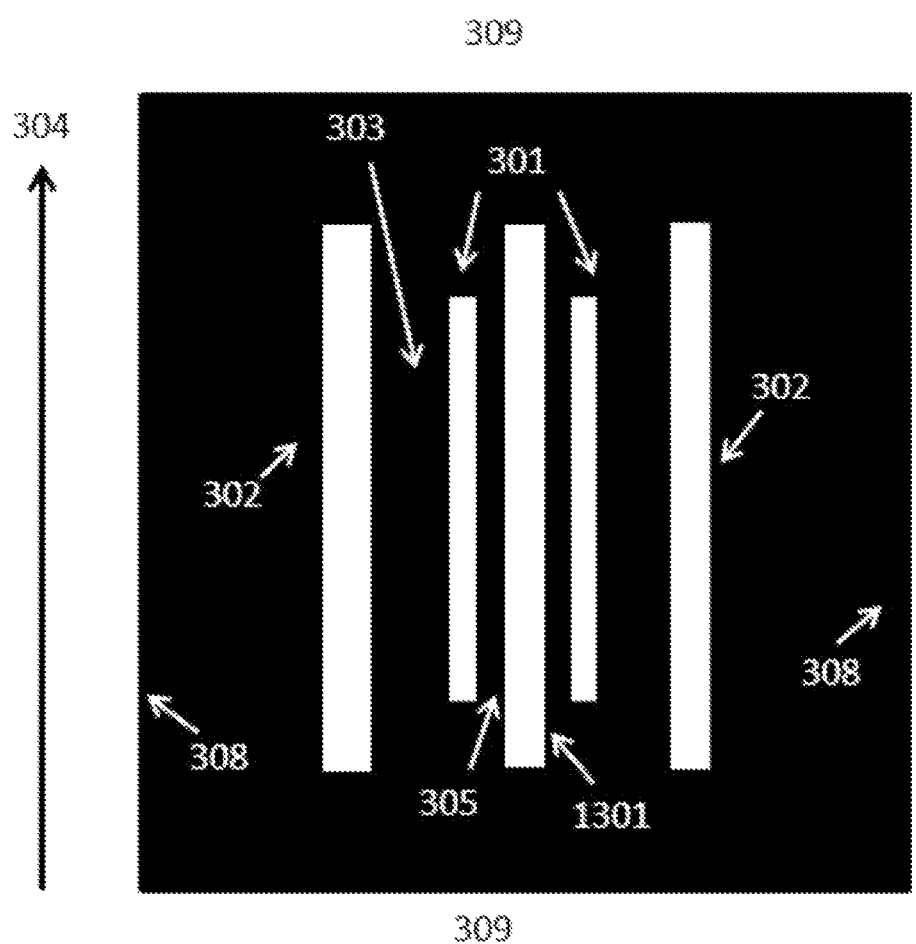
FIG. 13 shows an OVJP depositor with an exhaust aperture positioned at the tip of a flow retarder according to an embodiment disclosed herein.
Figure 14A:
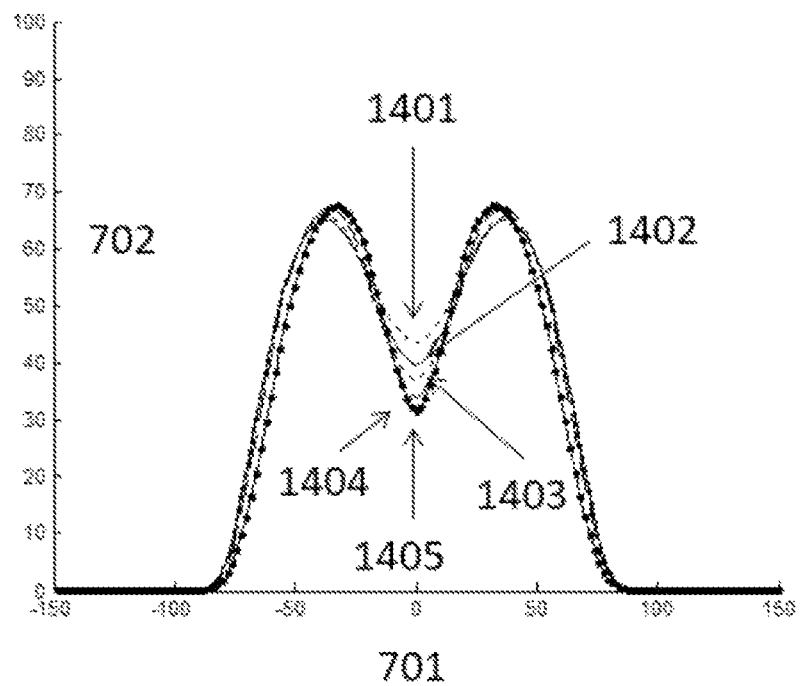
FIG. 14A shows examples of thickness profiles of features printed by two different OVJP depositors with exhaust apertures positioned at the tip of the associated flow retarders according to an embodiment disclosed herein.

In many embodiments, the DE spacer may be of comparable thickness to the flow retarder, so it may be expected to have a similar degree of undercut if the channels defining the depositor are made with DRIE. The effect of undercut on the DE spacer should also be included in this analysis. Allowing undercut DE spacers results in a depositor structure as shown in FIG. 12A, referred to as Geometry F. FIG. 12A shows two delivery apertures 1201 separated by a flow retarder 1202. Beyond the delivery apertures are DE spacers 1203 and exhaust apertures 1204. The amount of inset for the DE spacer and flow retarder is the same for a given value of y. It is minimal at y=0, shown at 1205, and maximal at the ends of the depositor 1206. An angled DE spacer decreases $\eta_e$ because recessed regions of the spacer are less effective at bringing delivery flow into contact with the substrate. The angled spacer is, on average, further from the depositor. The tips of both the DE spacer and the flow retarder in Geometry F may have the same angle as the flow retarder in Geometry C. The angles are reversed for Geometry G, which is analogous to Geometry D. Finally, Geometry H provides an embodiment with a normal tipped flow retarder and DE spacer inset from the aperture plane by s=15 μm. Geometry H, rather than A, may be the appropriate control case for determining the effect of a variable inset since it has the same average inset as F and G. FIG. 12B shows feature profiles deposited by Geometries F, G, and H at 1207, 1208, and 1209, respectively.

The decrease in $\eta_e$ may be much more severe for Geometry G than for F and H. The increased DE spacer offset has a much greater effect on depositor performance near its center than at its ends because the deposition per unit length is lower near the ends of the depositor. Accordingly, further decreases there do not significantly change the overall deposition rate. Conversely, if the DE spacer is raised relative to the substrate near the center, more organic vapor may be lost. Likewise, the feature printed by Geometry G is narrower than that printed by F or H, since the deposition zone is normally widest near the depositor midline.

A depositor having Geometry F performs comparably to H in feature size and $\eta_e$. However, there may be a loss of deposition uniformity. The deposition may be relatively sharply peaked on the sides of the flow retarder because s is smallest near the midline where deposition is most rapid. This can be corrected by setting an optimal minimal value of s=7.5 μm in Geometry I, also shown in FIG. 12B as 1210. The minimum inset is defined lithographically and is independent of the undercut. While the presence of an undercut may adversely affect depositor performance, it may not degrade performance sufficiently to prevent the fabrication of a useful depositor. The undercut typical of a fabrication process consistent with embodiments disclosed herein may be less than a third of the undercut in geometries F and I. Such a depositor is presented as Geometry J with a minimum inset s(y=0)=15 μm.

TABLE II

| Geometry | s (y = 0 μm) | s (y = ±200 μm) | FW5M (μm) | $U_{50}$ (%) | $\eta_e$ (%) | Note |
|---|---|---|---|---|---|---|
| A | 15 | 15 | 145 | 97.5 | 12.2 | |
| B | 5 | 5 | 146 | 98.4 | 12.0 | chamfer |
| C | 0 | 30 | 147 | 95.1 | 11.7 | |
| D | 30 | 0 | 147 | 95.9 | 12.3 | |
| E | 10 | 40 | 147 | 98.5 | 12.0 | |
| F | 0 | 30 | 131 | 90.0 | 6.06 | Inset DE |
| G | 30 | 0 | 108 | 95.5 | 1.12 | Inset DE |
| H | 15 | 15 | 127 | 93.9 | 6.30 | Inset DE |
| I | 7.5 | 37.5 | 128 | 97.1 | 7.26 | Inset DE |
| J | 15 | 25 | 140 | 98.4 | 11.0 | Inset DE |

In an embodiment, a flow retarder may be used in conjunction with a central exhaust. FIG. 13 shows a flow retarder having a central exhaust channel 1301 according to an embodiment disclosed herein. The channel 1301 may be connected, for example, to a constant pressure reservoir to promote process stability. This will stabilize the position of the stagnation plane, which is determined by a pressure balance between the delivery and exhaust flows. Since the delivery flow is typically controlled by flow rate, excursions in the delivery pressure are otherwise possible.

The hollow channel also may be in fluid communication with a vacuum source that withdraws delivery gas from the deposition zone at a constant mass flow rate. This vacuum source may be independent from that of the exhaust apertures so that the hollow central channel acts as a secondary exhaust. This type of depositor features the same aperture dimensions as the previous cases, but the tip of the flow retarder is flush, s=0, with the plane of the delivery aperture. A 15×500 μm aperture exhaust runs through the center of the flow retarder. Total exhaust flow remains at 4 sccm as in previous cases, with 0, 2.5, 5, 10, and 20% of the exhaust flow drawn through the center of the flow retarder, as shown at 1401, 1402, 1403, 1404, and 1405, respectively. Deposition profiles printed by a depositor as shown in FIG. 13 are shown FIG. 14A. This approach may not be beneficial for some embodiments, such as to fabricate for display-sized features, because the $U_{50}$ decreases as the flow through the center of the retarder increases while other figures of merit are unaffected. Summary data is provided in Table III.

Figure 14B:
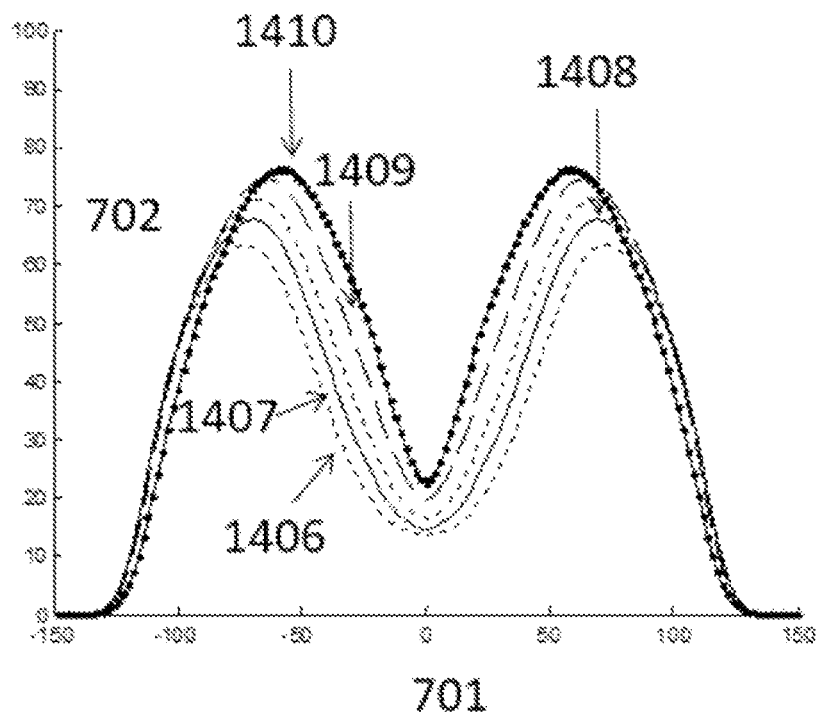
FIG. 14B shows examples of thickness profiles printed by OVJP depositors according to embodiments disclosed herein.

The presence of an exhaust in a flow retarder can improve $\eta_e$ for the case of larger depositors intended to print features for solid state lighting. An example of such a depositor may have dimensions of B=135 μm, D=15 μm, DE=45 μm, E=15 μm and g=50 μm. The central flow retarder contains a 15×500 μm exhaust aperture. The profiles of features printed by this structure are depicted in FIG. 14B with central exhaust flow of 0, 2.5, 5, 10, and 20% of the total flow, as shown at 1406 1407, 1408, 1409, and 14010, respectively.

Even when no exhaust is drawn through the flow retarder, $\eta_e$ may be increased over geometry A due to the larger DE spacers. It further increases with exhaust flow through the center of the retarder. As before, uniformity declines with increasing exhaust flow through the flow retarder. Most of the increase in deposition rate with greater exhaust flow occurs underneath the delivery apertures, leaving the center proportionally thinner. This non-uniformity can be mitigated with additional depositor passes that interlace the thin regions of printed features from one pass with the thick regions of others. A staggered aperture configuration analogous to U.S. patent application Ser. No. 15/475,408, filed Mar. 31, 2017 based on this depositor design may also be possible.

Figure 15:
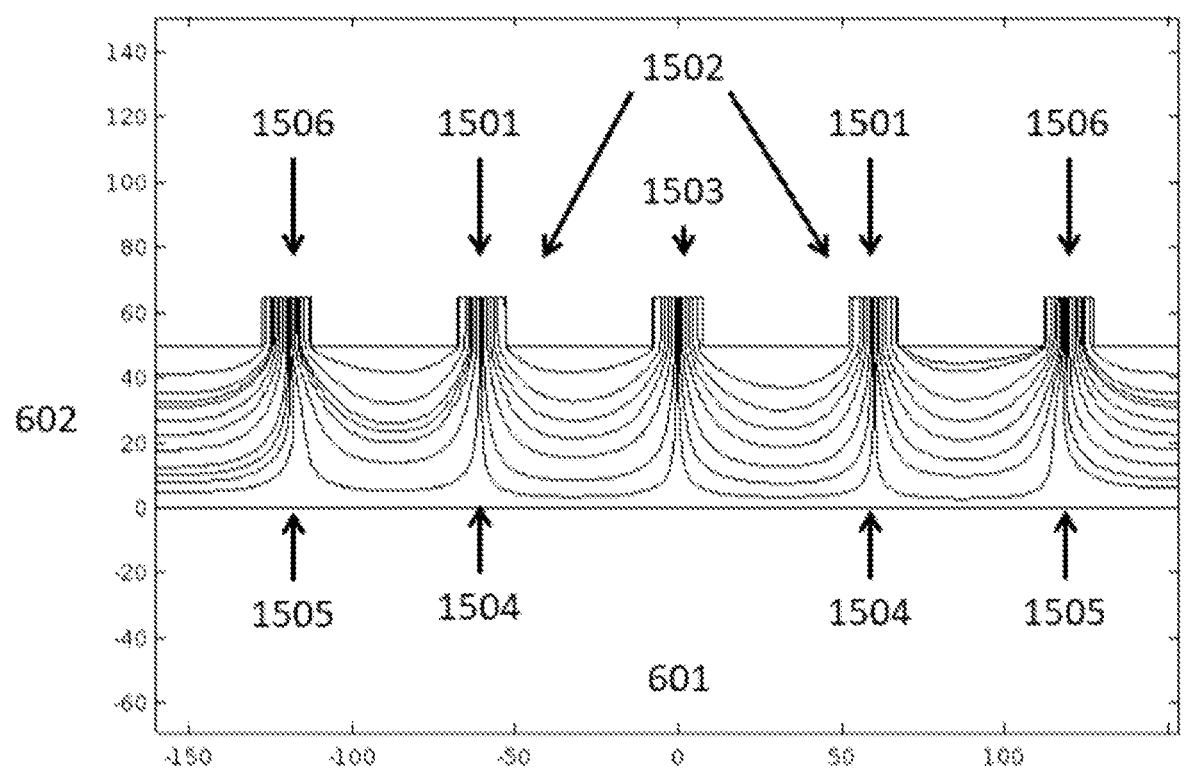
FIG. 15 shows the effect on the process gas flow field generated by a depositor with an exhaust aperture positioned at the tip of its flow retarder according to an embodiment disclosed herein.

An example of streamlines of flow for a wide depositor with a central exhaust are shown in cross section in FIG. 15. Two delivery apertures 1501 surround the sides of a central flow retarder 1502. The flow retarder draws an exhaust flow through a hollow central aperture 1503. A high central exhaust flow improves $\eta_e$ of the depositor by causing the streamlines of delivery gas flow to evenly bifurcate at their impingement 1504 with the substrate. Delivery flow that does not leave through the central exhaust moves outwards where it abuts the confinement flow 1505. The delivery and confinement flows both turn upwards and combine to leave through the side exhausts 1506. This brings the fastest moving portion of the delivery jet into close contact with the substrate and enhances organic vapor transport to the substrate on both sides of the bifurcation. In contrast, the streamlines of the delivery jets shown in FIGS. 6 and 10 that do not bifurcate. There is an optimum ratio of central to outside exhaust, although the specific value may depend on other process parameters. It was found that the optimum ratio was approximately 20% for the modeled conditions. Excessive flow through the central exhaust may skew the delivery flow inward, making the bifurcation uneven and reducing $\eta_e$.

TABLE III (Central Exhaust)

| B | DE | C Ex. (%) | FW5M (μm) | $U_{50}$ (%) | $\eta_e$ (%) |
|---|---|---|---|---|---|
| 45 | 30 | 0 | 151 | 68.0 | 11.5 |
| 45 | 30 | 2.5 | 151 | 59.8 | 11.3 |
| 45 | 30 | 5 | 150 | 52.2 | 11.2 |
| 45 | 30 | 10 | 149 | 41.1 | 11.1 |
| 45 | 30 | 20 | 144 | 31.5 | 10.6 |
| 135 | 45 | 0 | 240 | 55.0 | 14.3 |
| 135 | 45 | 2.5 | 239 | 39.4 | 15.7 |
| 135 | 45 | 5 | 238 | 31.6 | 16.8 |
| 135 | 45 | 10 | 236 | 25.2 | 18.2 |
| 135 | 45 | 20 | 230 | 20.2 | 18.6 |
| 135 | 45 | 30 | 219 | 18.2 | 16.7 |

Figure 16A:
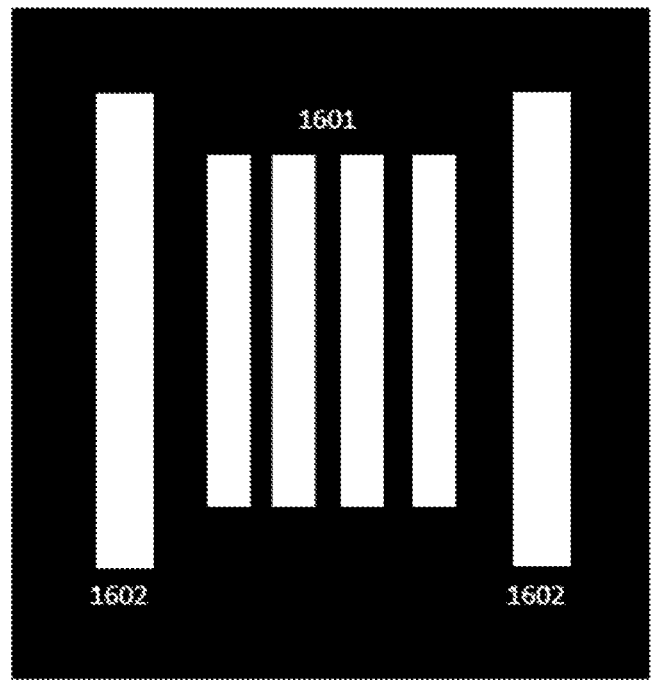
FIG. 16A and FIG. 16B show examples of OVJP depositors with multiple flow retarders according to embodiments disclosed herein.
Figure 16B:
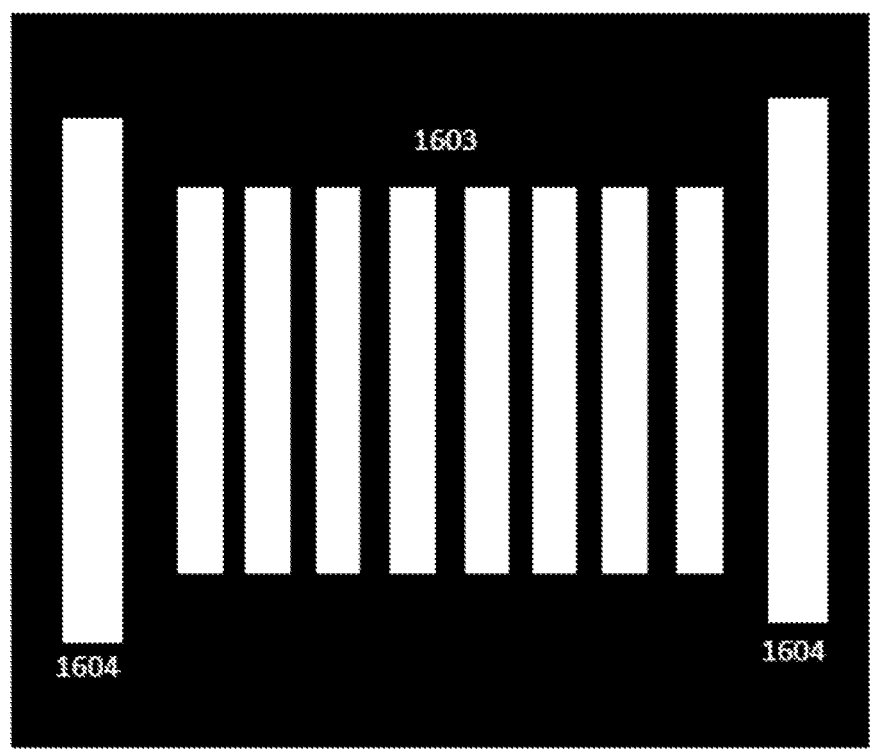

In an embodiment, multiple flow retarders may be used. For example, a delivery channel may be broken into more than two apertures by adding additional flow retarders as shown in FIG. 16A. Such a configuration may further increase the width of the plateau at the center of the deposition profile, but also may increase the overall feature size. In an example configuration as shown, the delivery aperture may have three flow retarders distribute the delivery flow between four identical regions 1601 arranged in a linear array between two exhausts 1602. The number of flow retarders may be further increased, as shown in FIG. 16B. In this example, the delivery aperture has seven flow retarders that distribute the delivery flow between eight identical regions 1603 arranged in a linear array between two exhausts 1604.

Multiple flow retarders can have constant insets s or can have angled tips that vary the offset as a function of y. Individual retarders in a delivery aperture may also have different insets from each other. Best results are achieved in the case of a symmetric depositor with an odd number of flow retarders that breaks the delivery aperture into an even number of sections. A centrally positioned retarder slows flow velocity at x=0 and prevents a local maximum in organic flux leading to non-uniform deposition. More generally, embodiments disclosed herein may use any combination of numbers of flow retarders with uniform or individual insets, geometries, and/or symmetries.

Figure 17:
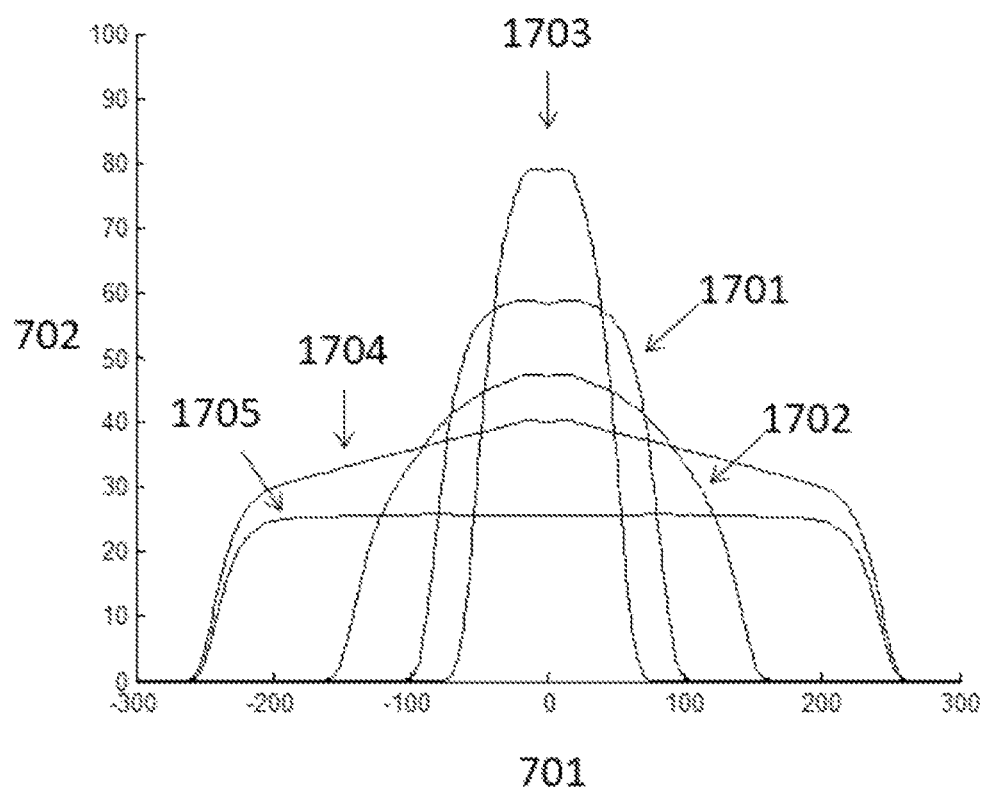
FIG. 17 shows thickness profiles of features printed by OVJP depositors with multiple flow retarders according to embodiments disclosed herein.

FIG. 17 and Table IV present data on the features deposited by geometries with three and seven retarders at 1701 and 1702, respectively. In both cases, B=15 μm, D=15 μm, DE=15 μm, E=30 s=0 and g=50. Both cases have excellent $U_{50}$, but the feature size, particularly for the seven flow retarder case, may be too large for display applications. A larger depositor permits slower delivery flow at a given mass flow rate, allowing more time for organic vapor to diffuse to the substrate, so $\eta_e$ increases. The deposition profile 1703 from a depositor with a single flow retarder is given for comparison.

Depositors with multiple flow retarders may be suitable for use in applications requiring relatively large printed features, such as OLED lighting and signage. In some embodiments, depositors may be expanded further by splitting the delivery aperture with additional flow retarders. For example, fifteen flow retarders may be used to split a delivery aperture into sixteen sections. Since such a depositor generally would not be intended for use in fabricating displays, $U_{50}$ is not the best measure of uniformity for them. The uniformity over 400 μm, $U_{400}$, is a better measure. If the delivery gas flow out of each delivery aperture section is equal for the fifteen flow retarder case, the resulting deposition profile 1704 has a distinct peak near the centerline that may adversely affect its uniformity. This peak may be reduced or eliminated by adjusting the spacing between each flow retarder so that flow through the outer delivery apertures is greater than flow through the inner ones. A set of spacings such that D1=13 µm, D2 and D3=14 µm, D4 and D5=15=µm, D6 and D7=16 µm and D8=17 µm, where D1 is the width of each of the innermost pair of delivery apertures, D8 is the width of the aperture adjacent to the exhaust, and other spacings are numbered outward from the D1 to D8, optimizes uniformity for flow retarders of width B=15 µm. Features with extremely wide mesas 1705 can be printed, so that 400 µm of the 500 µm feature it prints would be suitable for device growth. An array of OLEDs printed using this depositor design could therefore have an extremely high device fill factor, with an excluded inter-subpixel region comprising as little as 10% of the substrate. Data for features printed by these depositors are also given in Table IV and FIG. 17.

TABLE IV (Multiple Flow Retarders)

| # Retarders | Even Spaced | FW5M (µm) | $U_{50}$ (%) | $U_{400}$ (%) | $\eta_e$ (%) |
|---|---|---|---|---|---|
| 3 | Y | 178 | 98.7 | N/A | 13.4 |
| 7 | Y | 290 | 98.9 | 75.0 | 16.3 |
| 1 | Y | 119 | 94.3 | N/A | 11.1 |
| 15 | Y | 497 | 98.8 | 71.1 | 24.8 |
| 15 | N | 498 | 99.1 | 96.0 | 18.1 |

In some embodiments, one or more partial flow retarders may be used, such that the flow retarder does not span the full length of the delivery channel. An example of such a configuration is shown in FIG. 18A, referred to as Geometry K. The base 1801 of the retarder is attached to end of the delivery channel and its opposite surface 1802 extends into the delivery aperture 1803. The retarder may be flush with the delivery aperture or it may be recessed inside the delivery channel as in the previously discussed geometries. An incomplete retarder does not separate the delivery aperture into two topologically distinct sections. Lengths of the delivery aperture that do not contain a flow retarder 1804 may be narrowed to maintain balanced flow with the regions bifurcated by a retarder. Likewise, portions of the exhaust can be widened 1805 to accommodate locally increased delivery flow.

In an embodiment, one or more partial retarders may be placed on both sides of the delivery apertures. FIG. 18B shows an example of such a configuration, referred to as Geometry L. If the retarders 1806 are aligned, the gap 1807 between them extends through the midline of the channel. The non-bifurcated portion of the delivery channel is narrowed to control the distribution of delivery flow along its length. Adjusting delivery flow may prove particularly useful in situations where the confinement flow is fed from the edge of the depositor as opposed to its sides. As another example, Geometry L† may be identical to Geometry L, except that confinement flow is sourced from the ends of the depositor as opposed to the sides. Reduced delivery flow near the depositor midline counterbalances exhaust starvation, allowing for a useful feature to be printed. Sourcing confinement gas from the edges of a depositor array increases the density with which depositors can be packed into a linear array.

Figure 19A:
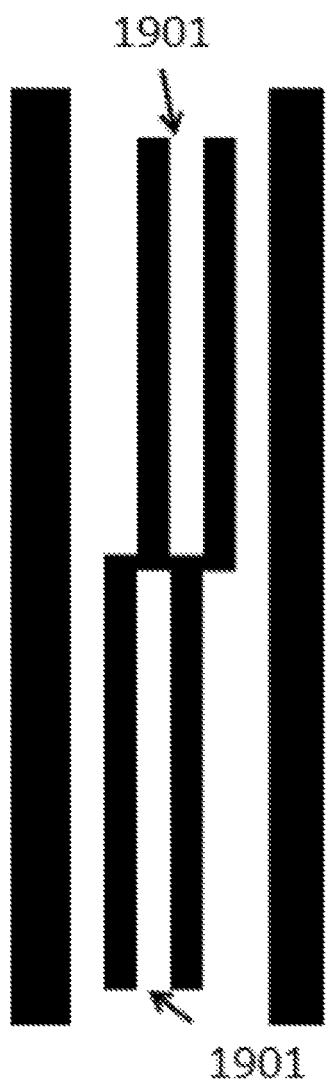
FIG. 19A shows an OVJP depositor configuration with interdigitated partial retarders in the delivery aperture according to embodiments disclosed herein.

Multiple flow retarders 1901 on each side may be interdigitated. FIG. 19A shows an example of such an arrangement. This structure is referred to as Geometry M and is similar in concept to the split delivery aperture geometry disclosed in U.S. patent application Ser. No. 15/475,408, filed Mar. 31, 2017. The aperture sidewalls are offset from each other to control the width of each portion of the delivery aperture.

Figure 19B:
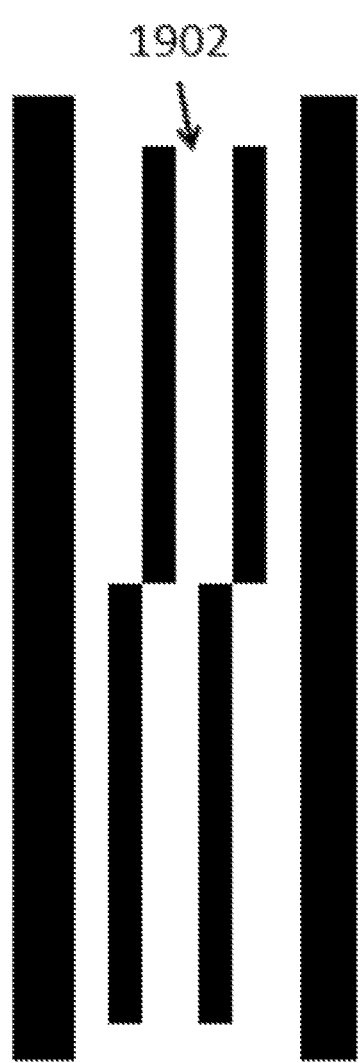
FIG. 19B shows an OVJP depositor with a single skewed retarder according to embodiments disclosed herein.

FIG. 19B shows an embodiment having interdigitated flow retarders. An arrangement such as shown in FIG. 19B, referred to as Geometry N, may be functionally similar to, but topologically distinct from FIG. 19A. In this embodiment a single retarder 1902 extends from one side of the delivery aperture to the other. The flow retarder is kinked at its midline so that it creates an asymmetry in the cluster of delivery apertures formed by its bifurcation. Regions of high organic vapor flux on one half of the depositor overlay regions of low organic flux on the other half. The contributions from each side sum as the print head is rastered across the substrate. This produces a mesa-like deposition profile that has exceptionally uniform thickness in the vicinity of its center.

Figure 20:
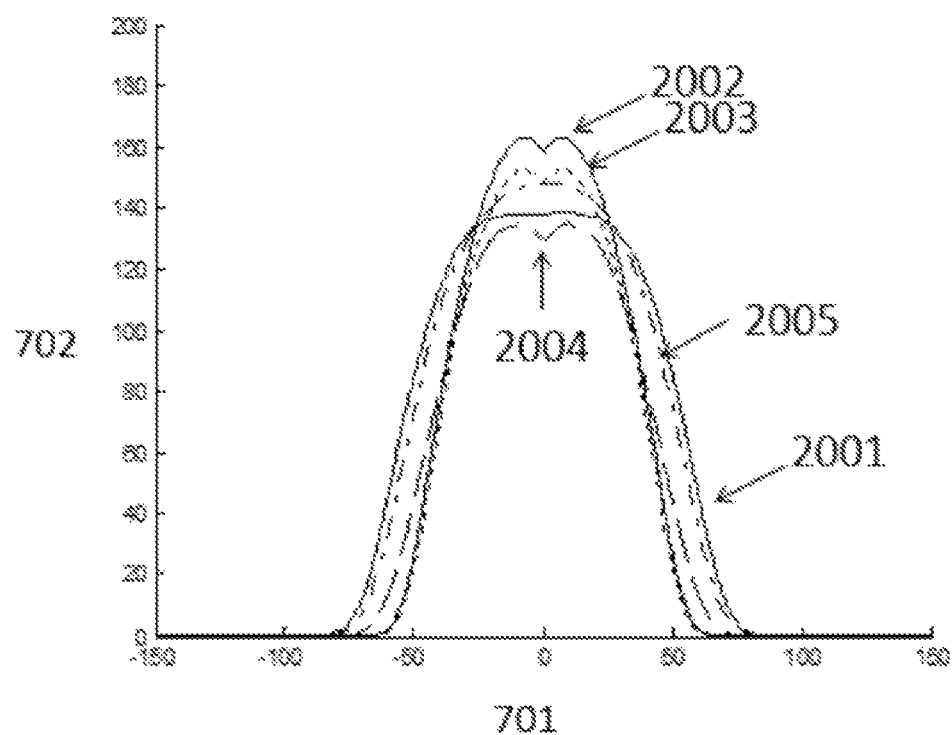
FIG. 20 shows thickness profiles of features printed by OVJP depositors with partial or skewed retarders according to embodiments disclosed herein.

The profile of a feature printed by Geometry N 2001 (solid) is plotted in FIG. 20. It has 15 µm wide exhaust apertures, a 30 µm wide DE spacer, a 15 µm narrow DE spacer and a pair of 15 µm wide delivery channels. The delivery channels are separated by a 18 µm wide retarder and the their upper and lower segments are offset by 15 µm. The deposition profiles for Geometries K 2002 (solid), L 2003 (dotted), L† 2004 (dashed), and M 2005 (dot-dash) are also plotted for comparison. For these depositors, E, DE, and D=15 µm, with 15 µm wide retarders. Single partial retarders are 200 µm in length, and paired partial retarders are 100 µm each in length. Data for these depositors is summarized in Table V.

The plots and summary data reveal that Geometries K and L behave very similar to each other. This is because the feature printed by each is a sum of deposition from bifurcated and non-bifurcated regions of delivery aperture that are of each of equal total length. Geometry L† is broader at its center due to the greater contribution of organic material the non-bifurcated central region of the delivery aperture relative to the distal portions. Geometry M and N behave similarly, however the deposition profile of Geometry M is more rounded. Its uniformity over the region of interest is therefore inferior to that of Geometry N. The offset of the skewed retarder is an additional parameter that can be optimized in Geometry N to deposit a mesa-like feature.

TABLE V

| Geometry | FW5M (µm) | $U_{50}$ (%) | $\eta_e$ (%) |
|---|---|---|---|
| K | 111 | 85.0 | 4.16 |
| L | 110 | 83.3 | 3.28 |
| L† | 127 | 90.3 | 3.20 |
| M | 140 | 92.2 | 3.59 |
| N | 146 | 97.4 | 3.68 |

Figure 21:
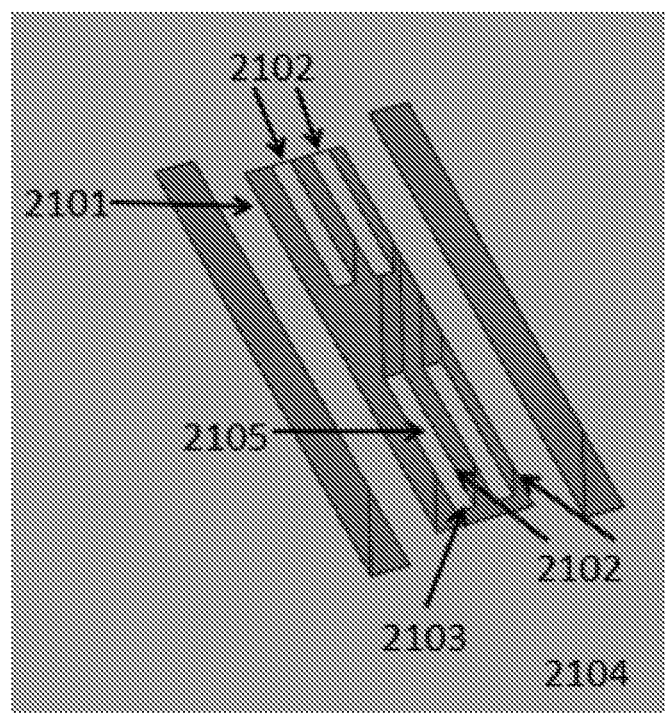
FIG. 21 shows a rendering of a depositor with sets of partial flow retarders that are inset within the delivery aperture according to an embodiment disclosed herein.

In some embodiments, a partial or skewed retarder may also be recessed behind the delivery aperture, similar to the straight retarders described in previous sections. An example of such a configuration is shown in FIG. 21. Four partial retarders 2102 are recessed from the delivery aperture 2101. The offset is visible in the discontinuity 2103 between the lower surface of the nozzle array 2104 and the face of a retarder 2105. Each retarder may have a flat bottom face, and may be aligned to a mate on the opposite end of the delivery channel, and inset/or from the delivery aperture by a constant value. Any inset, either constant or variable with aperture length, may be employed for each separate partial or skewed retarder. Partial retarders in a common aperture may have the same or different lengths. Any number of partial retarders may appear on either end of the delivery aperture. Partial retarders on opposite ends of the delivery channel may be aligned with each other, interdigitated, or oriented in any other manner with respect to each other. Partial or skewed flow retarders may likewise have any cross sectional shape and thickness and these may be variable along their length. Cross sectional shape or thickness may also vary between partial or skewed retarders in the same aperture. Partial, skewed, and traditional linear retarders may coexist within the same delivery channel.

Figure 22:
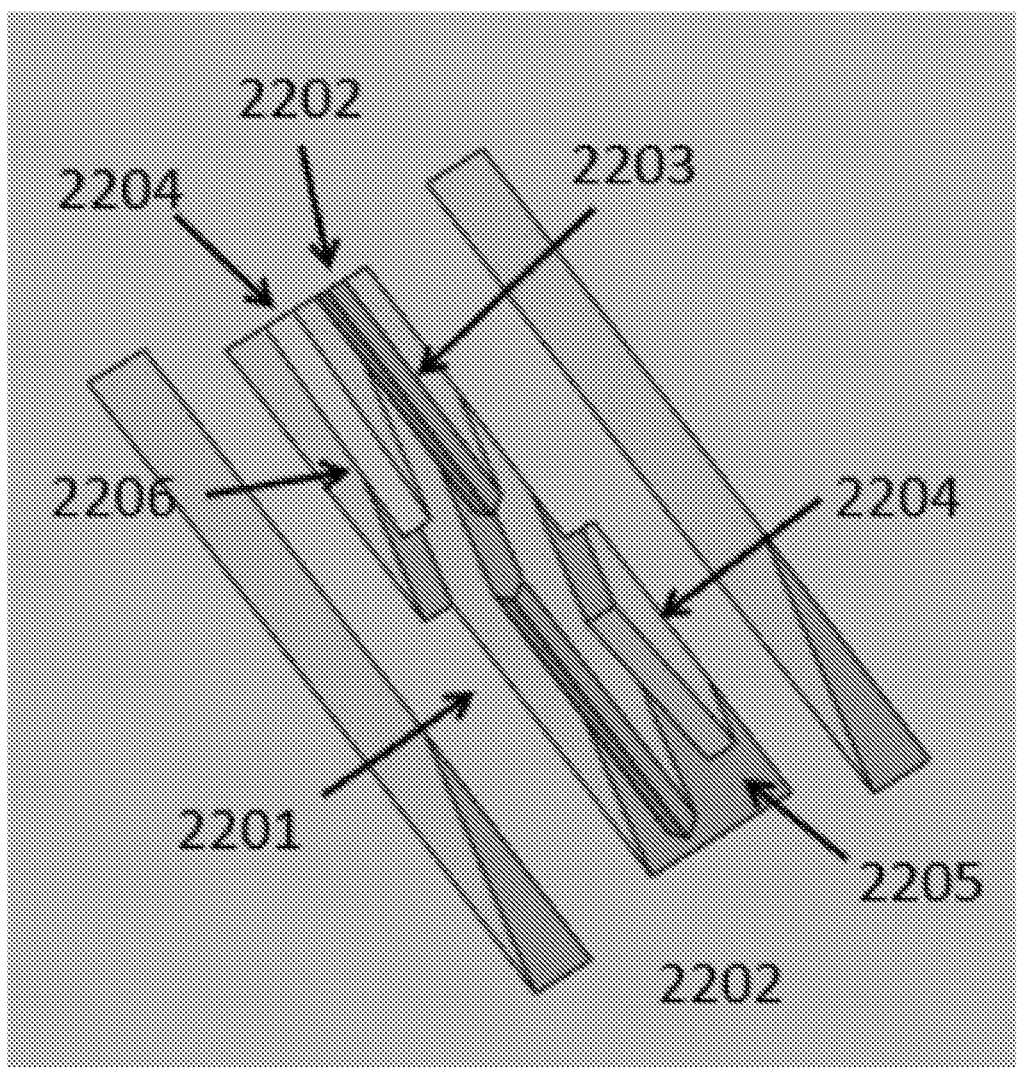
FIG. 22 shows a rendering of a depositor featuring multiple partial flow retarders of variable cross section and inset.

FIG. 22 shows an example of a depositor with more complex flow retarder geometry according to an embodiment disclosed herein. A delivery aperture 2201 contains an interdigitated pair of long partial retarders 2202. These retarders each have a small offset within the delivery aperture and each have a cross section that forms a chamfered lower surface 2203. A second, shorter set of partial retarders 2204 is also present in the aperture. These retarders have a greater overall inset 2205 than the longer pair. The lower surface of these retarders 2206 is sloped so that that the inset varies as a function of delivery aperture length.

Micronozzle arrays containing split aperture depositors as disclosed herein may be fabricated by bonding SI wafer pairs with arrays of trenches on the surfaces formed by deep reactive ion etching. Bonding the wafer pair creates closed channels. A wafer pair may be diced to form individual micronozzle arrays with depositors along their edges. The apertures of the depositors may be defined by the intersection of a channel and a dicing line. An example of a suitable fabrication process is described in greater detail in U.S. Patent Publication No. 2016/0376787, the disclosure of which is incorporated by reference in its entirety. Continuous apertures that are symmetric about the bond line, such as the exhaust apertures, may be formed from mirror image trenches that overlay each other at dicing line. Conversely, apertures that are only present on one side of the bond line may be created from trenches that do not overlay each other. Each aperture of the split delivery aperture pair may be defined along the bond line by an unetched wafer surface and around the rest of its perimeter by an etched trench in the etched surface of the opposite wafer. The trench centerlines may be separated from each other by the desired aperture offset distance. More generally, techniques used to fabricate DEC OVJP arrays also may be used to fabricate depositors disclosed herein.

Depositor geometry disclosed herein are expected to reduce TAKT time by allowing an OLED array to be printed in fewer passes that may be achieved with conventional techniques. Embodiments disclosed herein also may reduce contaminant exposure and improve the operational lifetime of printed OLEDs by reducing or minimizing the period between the initiation and completion of EML deposition for each OLED in an array.

EXPERIMENTAL

Depositors disclosed herein were simulated by computational fluid dynamics (CFD) in COMSOL MultiPhysics 5.2. A laminar flow of 1 sccm of N2 was fed through the delivery aperture or aperture cluster. The exhaust boundary condition was also specified as a laminar flow rate of 4 sccm. The micronozzle array was heated to 250° C. and the substrate was at 20° C. A millimeter square region between the print head and depositor surrounding the depositor was simulated. The pressure of N2 ambient surrounding the simulated volume was 200 Torr. Transport of organic vapor through the simulated region was solved with the steady state convection-diffusion equation.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic vapor jet printing (OVJP) deposition system comprising:
   an OVJP depositor comprising a solid monolithic block of material, the OVJP depositor further comprising:
      a delivery channel through the solid monolithic block of material, ending in a delivery aperture at an outer surface of the solid monolithic block of material;
      a first exhaust channel through the solid monolithic block of material; and
      a second exhaust channel through the solid monolithic block of material, wherein the delivery channel is disposed between the first exhaust channel and the second exhaust channel;
      wherein a portion of the solid monolithic block of material extends into the delivery channel to form a solid flow retarder that does not extend around an entire inner circumference of the delivery channel;
      wherein there are no delivery channels other than the delivery channel disposed between the first exhaust channel and the second exhaust channel;
   an organic material source in fluid communication with the delivery channel; and
   a delivery gas source in fluid communication with the organic material source and the delivery channel such that organic material provided by the organic material source is entrained in and transported by a delivery gas provided by the delivery gas source to the delivery channel.

2. The deposition system of claim 1, further comprising a confinement gas source in fluid communication with the delivery channel and with the exhaust channel.

3. The deposition system of claim 1, wherein the flow retarder comprises a hollow channel terminating in an aperture at a distal end of the flow retarder.

4. The deposition system of claim 3, wherein the hollow channel is in fluid communication with a constant pressure source.

5. The deposition system of claim 1, wherein the flow retarder extends into the delivery channel from only a single wall of the delivery channel.

6. The deposition system of claim 1, wherein the flow retarder has a width that varies as a function of length along the delivery aperture.

7. The deposition system of claim 1, wherein the flow retarder has a position that varies as a function of the length along the delivery channel.

8. The deposition system of claim 1, wherein the flow retarder has a rectangular cross section.

9. The deposition system of claim 1, wherein the flow retarder is chamfered to have a tapered cross section.

10. The deposition system of claim 1, wherein the OVJP depositor is symmetric about the flow retarder.

11. The deposition system of claim 1, wherein an odd number of flow retarders are disposed within the delivery aperture of the delivery channel.

12. The deposition system of claim 1, wherein the flow retarder has a non-uniform cross section.

13. The deposition system of claim 1, further comprising a second solid flow retarder disposed within the delivery channel.

14. The deposition system of claim 1, wherein the flow retarder has a width in the range 15-45 μm.

15. The deposition system of claim 1, wherein the flow retarder has a width of not more than 135 μm.

16. The deposition system of claim 1, wherein the solid flow retarder is disposed within 0-40 μm of the delivery aperture.

17. The deposition system of claim 16, wherein the solid flow retarder is disposed within 5-30 μm of the delivery aperture at the closest point to the delivery aperture.

18. The deposition system of claim 1, wherein the solid flow retarder has a width of at least 45 μm.

19. The deposition system of claim 1, wherein the OVJP depositor has a width of not more than w≤285 μm measured from an outer edge of the first exhaust channel to an outer edge of the second exhaust channel in a straight line across the delivery channel.

20. The deposition system of claim 19, wherein w≤135 μm.

21. The deposition system of claim 1, wherein the material is Si.

* * * * *